(12) United States Patent
Shroff et al.

(10) Patent No.: US 10,510,616 B2
(45) Date of Patent: Dec. 17, 2019

(54) POST CONTACT AIR GAP FORMATION

(71) Applicant: NXP USA, INC., Austin, TX (US)

(72) Inventors: Mehul D. Shroff, Austin, TX (US); Douglas Michael Reber, Austin, TX (US)

(73) Assignee: NXP USA, INC., Austin, TX (US)

( * ) Notice: Subject to any disclaimer, the term of this patent is extended or adjusted under 35 U.S.C. 154(b) by 105 days.

(21) Appl. No.: 15/843,215

(22) Filed: Dec. 15, 2017

(65) Prior Publication Data

US 2019/0206740 A1 Jul. 4, 2019

(51) Int. Cl.
| | | |
|---|---|---|
| H01L 21/00 | (2006.01) |
| H01L 21/8234 | (2006.01) |
| H01L 27/088 | (2006.01) |
| H01L 21/768 | (2006.01) |
| H01L 29/66 | (2006.01) |
| H01L 29/78 | (2006.01) |
| H01L 29/06 | (2006.01) |
| H01L 21/764 | (2006.01) |

(52) U.S. Cl.
CPC .... *H01L 21/823481* (2013.01); *H01L 21/764* (2013.01); *H01L 21/7682* (2013.01); *H01L 21/823431* (2013.01); *H01L 21/823437* (2013.01); *H01L 21/823468* (2013.01); *H01L 21/823475* (2013.01); *H01L 27/0886* (2013.01); *H01L 29/0649* (2013.01); *H01L 29/6653* (2013.01); *H01L 29/6659* (2013.01); *H01L 29/785* (2013.01); *H01L 29/7833* (2013.01); *H01L 29/66545* (2013.01)

(58) Field of Classification Search
CPC ........... H01L 21/823481; H01L 21/764; H01L 21/7682; H01L 21/823431; H01L 21/823437; H01L 21/823468; H01L 21/823476; H01L 27/0886; H01L 29/0649; H01L 29/6653; H01L 29/785; H01L 29/6659; H01L 29/7833
See application file for complete search history.

(56) References Cited

U.S. PATENT DOCUMENTS

| | | |
|---|---|---|
| 5,324,683 A | 6/1994 | Fitch et al. |
| 5,407,860 A | 4/1995 | Stoltz et al. |
| 5,736,446 A | 4/1998 | Wu |
| 5,770,507 A | 6/1998 | Chen et al. |
| 5,869,379 A | 2/1999 | Gardner et al. |

(Continued)

OTHER PUBLICATIONS

Cheng, K., "Air Spacer for 10nm FinFET CMOS and Beyond"; IEEE 2016.

(Continued)

*Primary Examiner* — Richard A Booth
(74) *Attorney, Agent, or Firm* — David G. Dolezal

(57) ABSTRACT

A method of making a semiconductor device with an air gap for a terminal of a semiconductor device includes forming a sacrificial sidewall spacer and removing the spacer after the formation of contact structures for the semiconductor device. The air gap is located in portions of the wafer where the sacrificial air gap was removed. Since the contacts are formed prior to the removal of the sacrificial spacers, air gaps can advantageously be formed without electrically conductive contact material undesirably being deposited in locations of the desired air gap.

20 Claims, 21 Drawing Sheets

(56) References Cited

U.S. PATENT DOCUMENTS

| | | |
|---|---|---|
| 5,914,519 A | 6/1999 | Chou et al. |
| 6,064,107 A | 5/2000 | Yeh et al. |
| 6,277,700 B1 | 8/2001 | Yu et al. |
| 6,861,332 B2 | 3/2005 | Park et al. |
| 6,864,135 B2 | 3/2005 | Grudowski et al. |
| 7,400,024 B2 | 7/2008 | Kunnen |
| 7,759,206 B2 | 7/2010 | Luo et al. |
| 2017/0162650 A1* | 6/2017 | Cheng ................. H01L 29/0649 |

OTHER PUBLICATIONS

Sachid, A., "FinFET With Encased Air-Gap Spacers for High-Performance and Low-Energy Circuits"; IEEE Electron Device Letters, vol. 38, No. 1, Jan. 2017.

* cited by examiner

POST CONTACT AIR GAP FORMATION

BACKGROUND OF THE INVENTION

Field of the Invention

This invention relates in general to the formation of semiconductor device terminal air gaps formed after contact formation.

Description of the Related Art

Semiconductor devices such as transistors utilize control terminal air gap spacers for providing a lower K (dielectric constant) dielectric spacer to reduce the capacitive coupling between a control terminal (e.g. gate of a FET) and other structures of a semiconductor device (e.g. a source contact or drain contact for a FET). In some examples, the lower K dielectric air gap spacer may reduce capacitive coupling between the structures thereby leading to better device performance (e.g. faster speed, lower $R_{ON}$) in some examples. One problem with forming semiconductor devices with air gaps is that conductive contact material can undesirably fill the air gap during manufacture, which may cause a shorting of the semiconductor device structures.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a method of making a semiconductor device with an air gap for a terminal of a semiconductor device includes forming a sacrificial sidewall spacer and removing the spacer after the formation of contact structures for the semiconductor device. The air gap is located in portions of the wafer where the sacrificial air gap was removed. Since the contacts are formed prior to the removal of the sacrificial spacers, air gaps can advantageously be formed without electrically conductive contact material undesirably being deposited in locations of the desired air gap.

Figure 1:
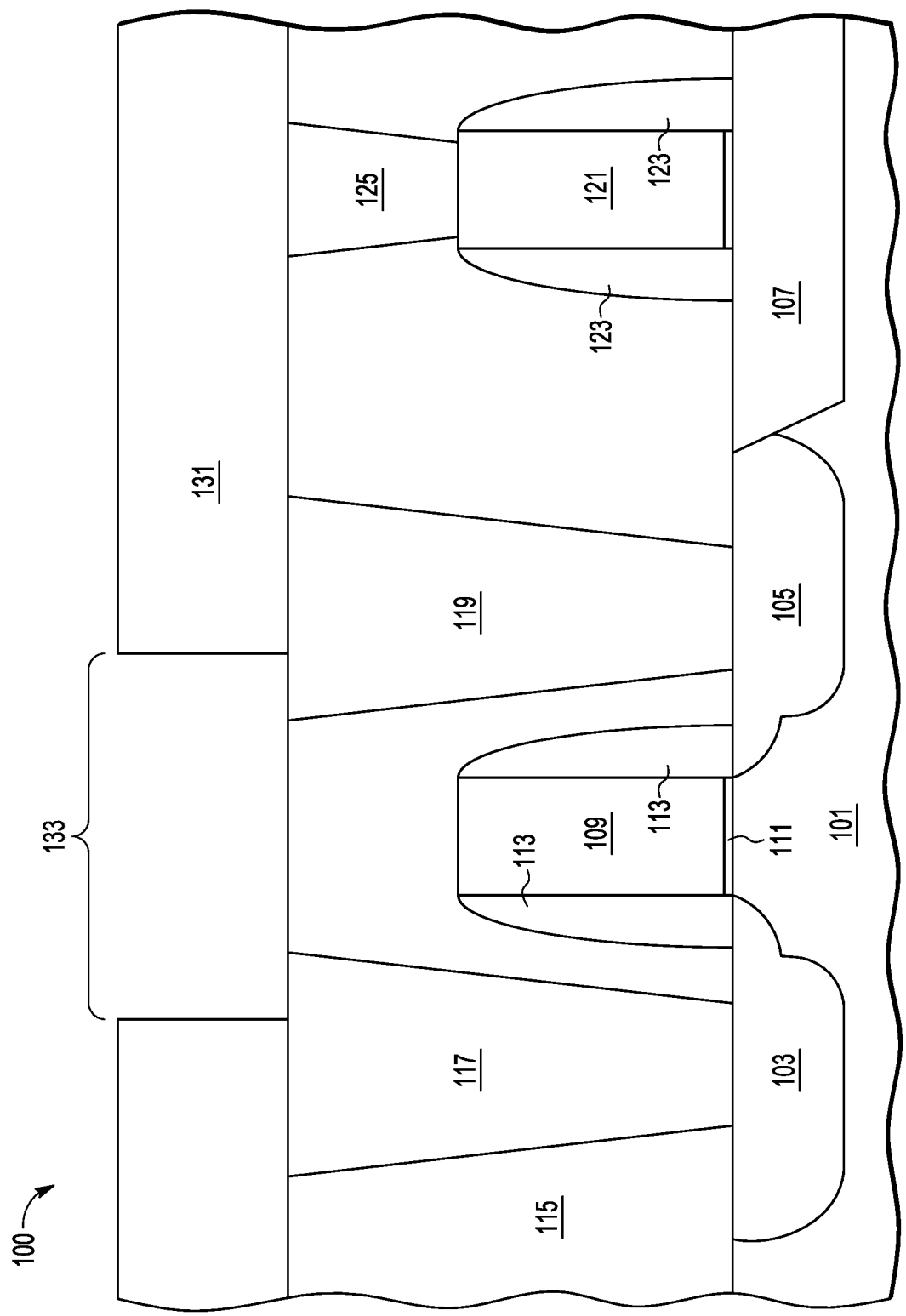
FIGS. 1-3 are partial cross-sectional side views of a wafer at various stages during the manufacture of a semiconductor device according to one embodiment of the present invention.

FIG. 1 is a partial cross-sectional side view of a wafer 100 used for forming a semiconductor device according to one embodiment of the present invention. In one embodiment, substrate 101 is made of bulk monocrystalline silicon but may be made of other semiconductor materials, for example, GaAs, ZnO, GaN, SiGe, AlP, InGaAs, SiC, GaP, or other IV or III-V semiconductor materials, in other embodiments. In some embodiments, wafer 100 may include a number of semiconductor fins, where the portion of substrate 101 shown in FIG. 1 is a semiconductor fin. In other embodiments, wafer 100 has a semiconductor on insulator (SOI) configuration.

In the view of FIG. 1, gate structures 109 and 121 are shown formed on a gate dielectric 111. In one embodiment, gate structures 109 and 121 are formed of a conductive material (e.g. polysilicon or a metal such as tantalum, tungsten, aluminum, or a combination thereof). Gate dielectric 111 is made of a dielectric material such as silicon dioxide, a nitride, or a high-K dielectric material. In one embodiment, gate structure 109 is for one semiconductor device (e.g. a transistor) and gate structure 121 is for another semiconductor device (e.g. a second transistor). The portion of gate structure 121 shown in FIG. 1 is located directly over an isolation region 107, but includes other portions located directly over a semiconductor material of substrate 101 in other locations. In other embodiments, structures 109 and 121 can be terminal structures for other types of semiconductor devices such as diodes, resistors, and capacitors.

Wafer 100 includes sidewall spacers 113 and 123 that are for gate structures 109 and 121 respectively. Spacers 113 and 123 are formed from a dielectric material such silicon oxide or nitrogen, but may be formed from other materials such as e.g. carbon that can be selectively etched with respect to the material of substrate 101 and gate structures 109 and 121.

In one embodiment, gate structures 109 and 121 are formed by pattering a layer of gate material. In one embodiment sidewall spacers 113 and 123 are formed by depositing a layer of spacer material over wafer 100 including over the patterned gate structures 109 and 121 and then anisotropically etching with an etch chemistry selective to the spacer material and selective with respect to the gate structure material. In one embodiment, the layer has a thickness in the range of 100-800 Angstroms, but may be of other thicknesses in other embodiments. In some embodiments, spacers 113 and 123 may be formed of multiple layers of different materials.

In one embodiment, after the formation of gate structures 109 and 121, substrate 101 is implanted with conductivity ion dopants (e.g. boron, phosphorous, arsenic) to form current terminal regions 103 and 105. For a FET, current terminal regions 103 and 105 are characterized as source regions and drain regions. In the embodiment shown, source/drain extension implants are made before the formation of spacer 113 and deeper implants are made after the formation of spacer 113. In the embodiment shown, a channel region is located in substrate 101 between regions 103 and 105 underneath gate structure 109.

After the formation of current terminal regions 103 and 105, a layer 115 of dielectric material is formed over substrate 101. In one embodiment, layer 115 is an oxide formed by a TEOS process, but may be made of other materials (e.g. nitride) and/or formed by other processes in other embodiments. In one embodiment layer 115 serves interlayer dielectric (ILD) 0 layer for an integrated circuit formed from wafer 100.

In some embodiments, gate structures 109 and 121 may be formed by a replacement gate process. In one embodiment of such a process, sacrificial gate structures (not shown) are formed of a material (e.g. polysilicon) in the locations of gate structures 109 and 121 shown in FIG. 1. After the formation of layer 115, layer 115 is planarized down to the top surface of the sacrificial gate structures, wherein the sacrificial gate structures are removed by an etching process. A layer or layers of replacement gate material (e.g. a metal or metals with the appropriate work function) is deposited on wafer 100 wherein the wafer is then planarized to remove gate material outside of gate structures 109 and 121. The type of gate material that is deposited may depend on the conductivity type of the transistor being formed. A second dielectric layer is then deposited on wafer 100 to the top level of layer 115 shown in FIG. 1. In such an embodiment, layer 115 is formed from two different layers formed at two different times.

Openings are formed in layer 115 to expose substrate 101 and structure 121 at the locations of contacts 117, 119 and 125. In one embodiment, the openings are formed by forming a patterned layer (e.g. of photoresist) (not shown) with openings at the appropriate locations. A layer of contact material (e.g. tungsten) is then formed on wafer 100 wherein layer 115 is planarized to removed excess material contact material. In some embodiments, contacts 117, 119, and 125 may include barrier layers (not shown) e.g. of titanium or titanium nitride. After the formation of contacts 117, 119, and 125, a patterned mask 131 is formed (e.g. of photo resist) over wafer 100.

Figure 2:
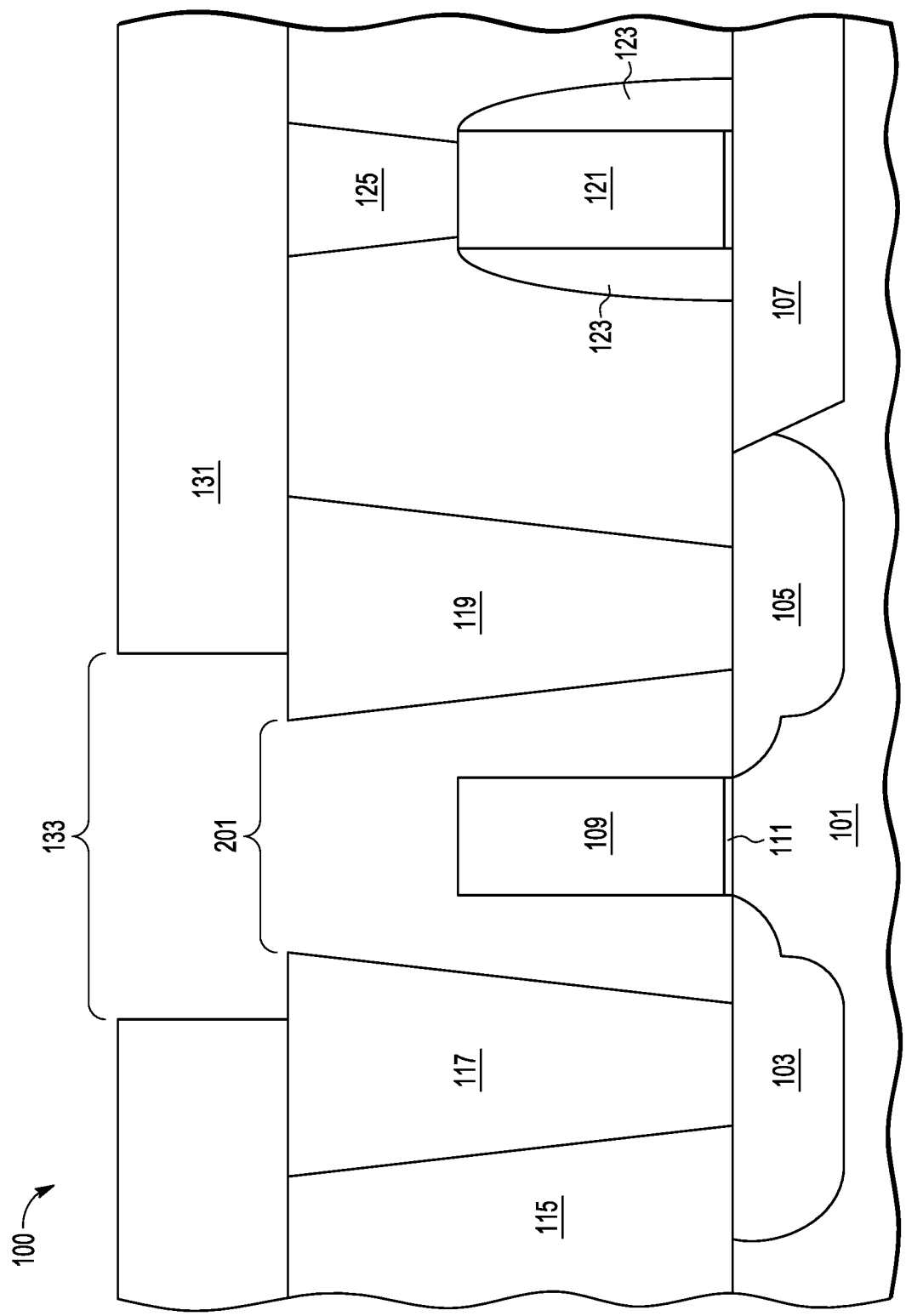

FIG. 2 shows a partial cutaway side view of wafer 100 after a portion of layer 115 and spacer 113 have been removed. In one embodiment, the portions of a layer 115 and spacer 113 are removed by an isotropic etching process with an appropriate etch chemistry (e.g., including HF or HBr) applied through opening 133 to remove both portions so as to form cavity 201. However, in other embodiments, the portions of layer 115 and spacer 113 may be removed by different etching processes if layer 115 is made of a different material than spacer 113. In other embodiments, dielectric layer 115 may be removed by an anisotropic process.

Figure 3:
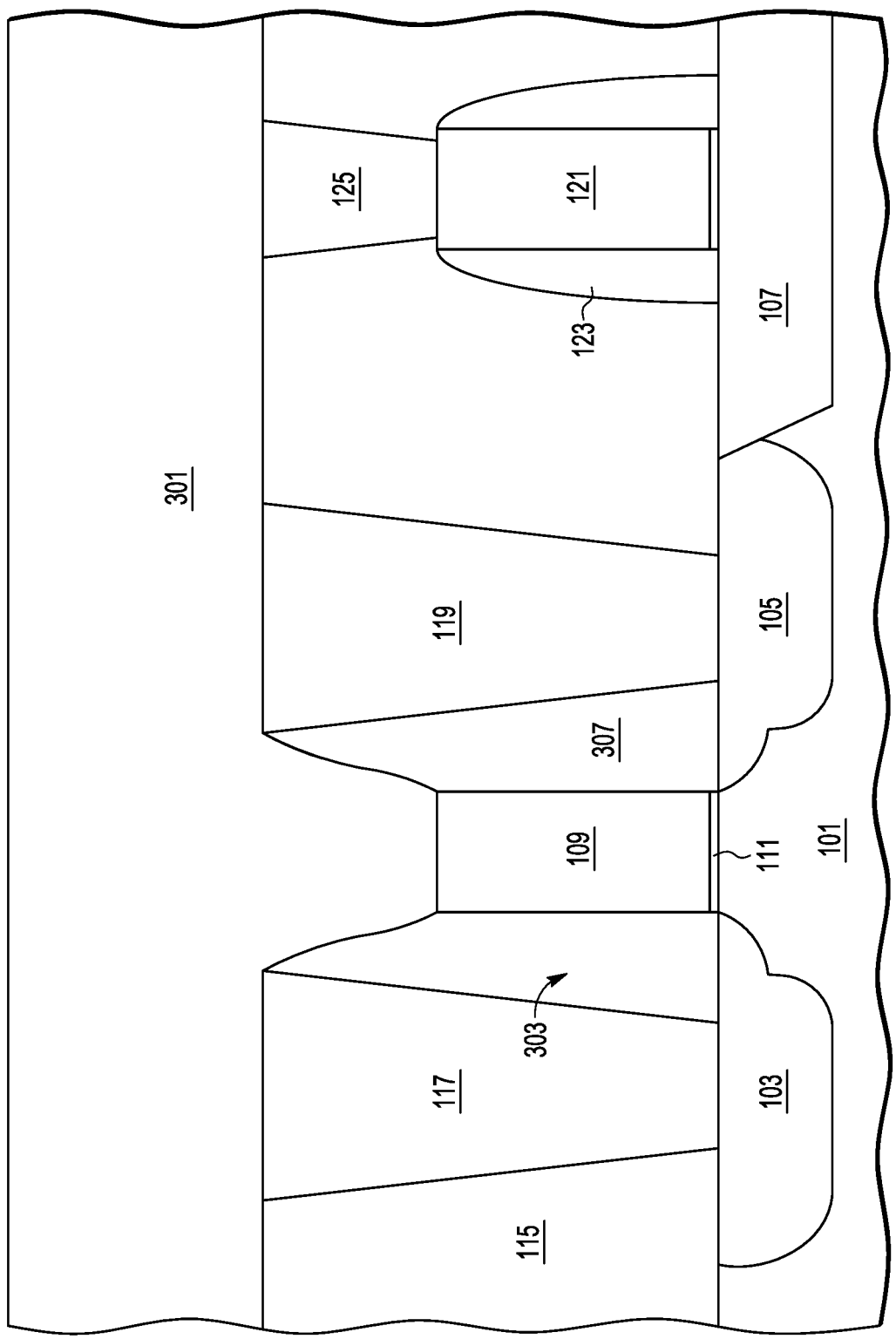

FIG. 3 shows a partial cutaway side view after a layer 301 of dielectric material is formed over wafer 100 to form air gaps 303 and 307 by sealing cavity 201. In one embodiment, layer 301 is made of an oxide (e.g. a TEOS oxide) or other suitable dielectric, and may be deposited by CVD (chemical vapor deposition) or other processes such as spin-on coating or physical vapor deposition (PVD). In some embodiments, the CVD and PVD processes are performed at higher pressures (e.g. in the range of 1000 Pa to 110,000 Pa) so that the material is more likely not to fill a small gap in that the mean free path of the deposition species is not long enough. Portions of layer 301 are formed on the top surface of gate structure 109. In the embodiment shown, no portions of the material of layer 301 are shown as being formed in cavities 303 and 307. However, in other embodiments, some material of layer 301 may be formed in cavities 303 and 307, depending on the process used in forming layer 301.

During the operation of the transistor shown in FIG. 1, air gaps 303 and 307 provide a lower dielectric constant insulation between conductive contact 117 and gate structure 109 and between gate structure 109 and contact 119 than if the gaps were filled with dielectric material. This lower dielectric constant insulation reduces the capacitive coupling between gate structure 109 and contacts 117 and 119 which may provide the transistor with faster switching speeds and lower $R_{ON}$ in some embodiments. Since contacts 117, 119, and 125 are formed before the formation of the sidewall air gaps 303 and 307, contact material is not undesirably formed in the air gaps.

After the view of FIG. 3, interconnects and vias are formed over wafer 100 to couple the transistor shown in FIG. 3 with other transistors formed on wafer 100 and to externally connecting structures (e.g. pads, bumps, posts). Afterwards, wafer 100 is singulated into multiple integrated circuits, each with multiple transistors with air gaps similar to air gaps 303 and 307 shown in FIG. 3. The integrated circuits are then packaged into integrated circuit packages and implemented in systems such as electronic systems.

Figure 4:
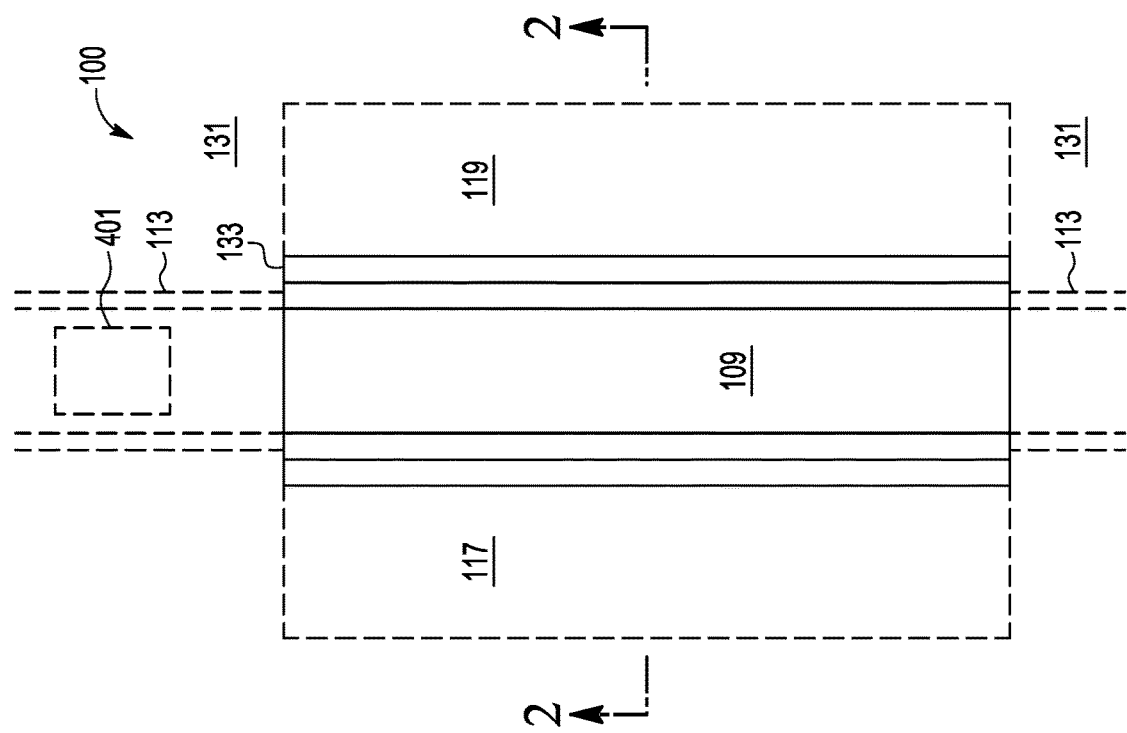

FIG. 4 is a partial top view one embodiment of wafer 100 at the stage of FIG. 2 after spacer 113 has been removed from the area of opening 133 and while mask 131 is still on wafer 100. As shown in the view of FIG. 4, gate structure 109 is an elongated structure that runs in a direction that is up and down in view of FIG. 4. A contact 401 contacts gate structure 109 at a location outside of opening 133. Contact 401 is similar to contact 125 and contacts gate structure 109 over an isolation structure (similar to isolation region 107).

Figure 5:
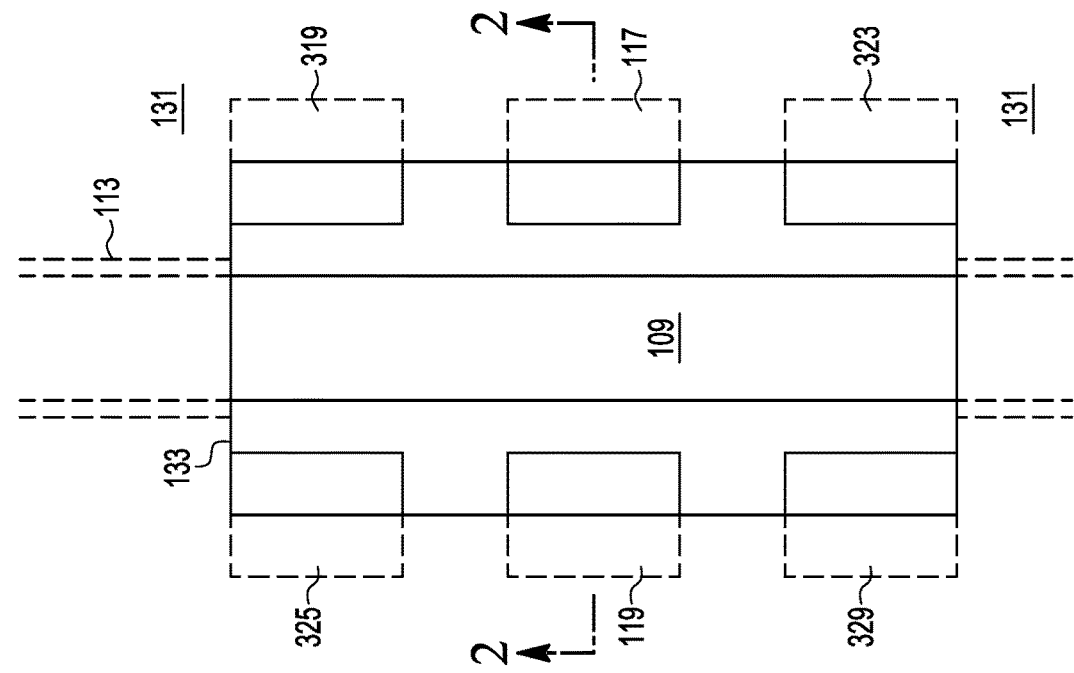
FIGS. 4 and 5 are partial top views of a wafer according to different embodiments of the present invention.

FIG. 5 is a top view of an alternative embodiment of wafer 100 wherein the current terminal contacts 117 and 119 do not extend along the length of the transistor channel as in FIG. 4 but instead are part of multiple contacts for a current terminal region. For example, contacts 325, 119, and 329 contact region 103, and contacts 319, 117, and 323 contact region 105. These contacts for each region are coupled together by higher level interconnects (not shown).

FIGS. 6-9 show partial cross-sectional side views of another embodiment for forming air gaps for a semiconductor device terminal structure. The items in FIGS. 6-9 having the same numbers as the items of FIGS. 1-5 represent similar structures.

Figure 6:
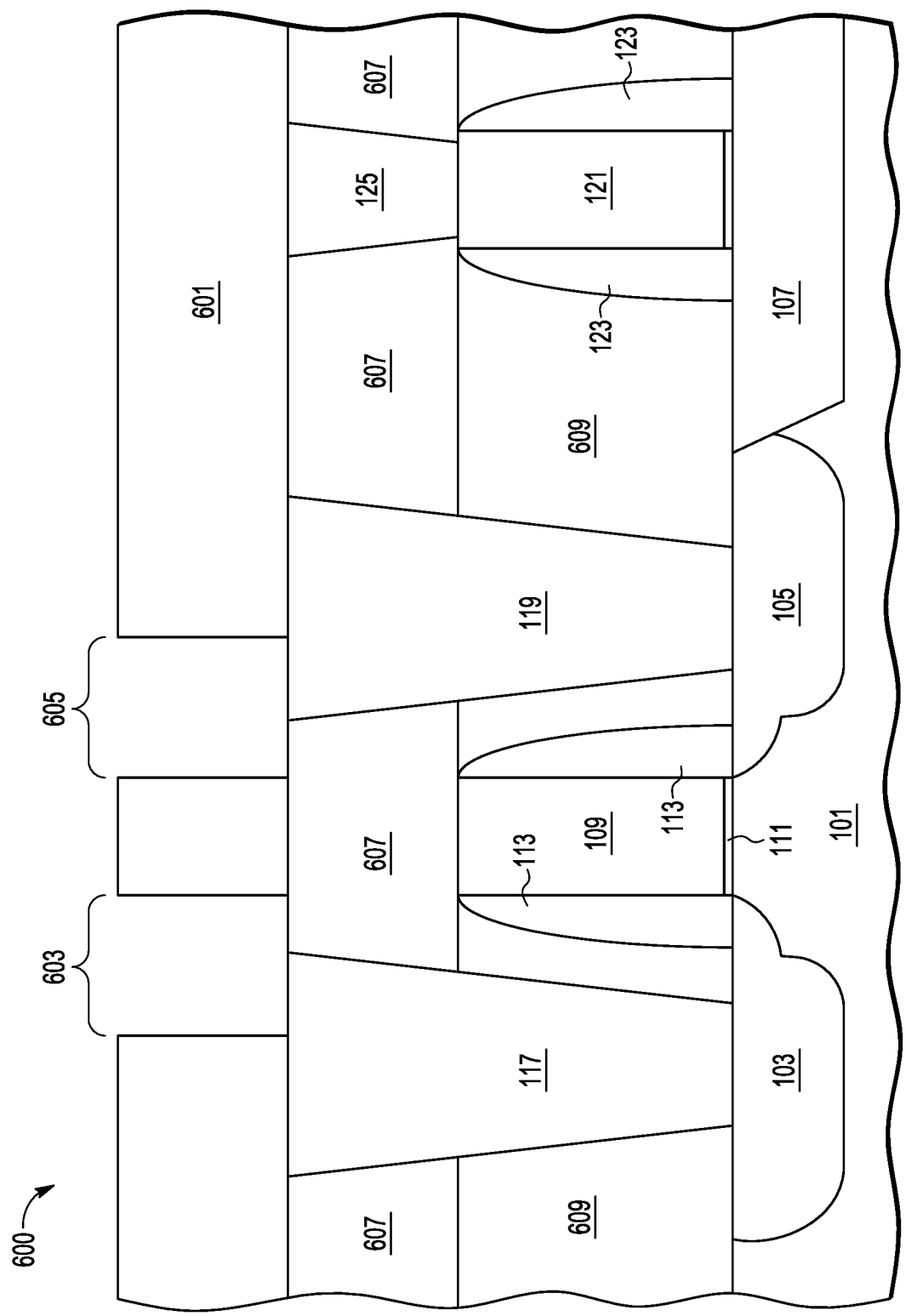
FIGS. 6-9 are partial cross-sectional side views of a wafer at various stages during the manufacture of a semiconductor device according to one embodiment of the present invention.

As shown in FIG. 6, a patterned mask 601 is formed on wafer 600 after the formation of contacts 117, 119, and 125. Mask 601 has two openings 603 and 605, each to expose an area lateral to the sides of gate structure 109.

Wafer 600 includes two dielectric layers 609 and 607 instead of one dielectric layer 115 as shown in the embodiment of FIG. 1. Gate structures 109 and 121 are metal replacement gate structures that are formed in the openings of the sacrificial material (e.g. polysilicon) gate structures (not shown) formed prior to the formation of spacers 113 and 123. The lower dielectric layer 609 is formed of a first dielectric material (e.g. silicon oxide formed by a TEOS process) and is formed prior to the deposition of the metal for replacement gate structures 109 and 121. The upper dielectric layer 607 is formed of a different dielectric material (e.g. nitride) and is formed after the deposition of the metal for replacement gates structures 109 and 121.

Figure 7:
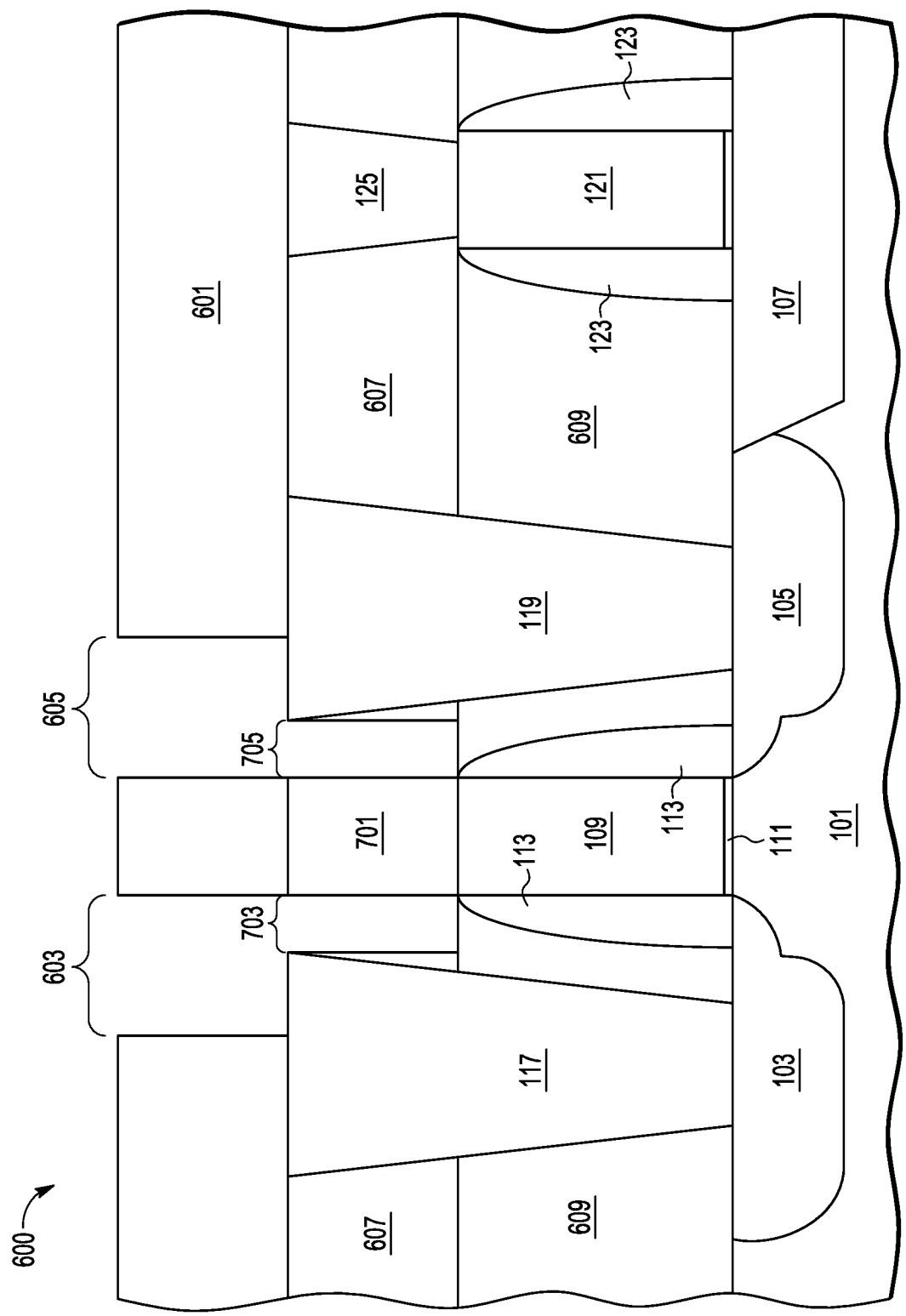

FIG. 7 shows a partial cutaway side view of wafer 600 after openings 703 and 705 are formed in layer 607 by an anisotropic etching process through openings 603 and 605, respectively, to expose portions of layer 609. In one embodiment where layer 607 is made of nitride, layer 607 is etched with an etch chemistry comprising of, for example, CHF3 and SF6. Anisotropically etching layer 607 leaves a portion 701 of layer 607 located directly over gate structure 109.

Figure 8:
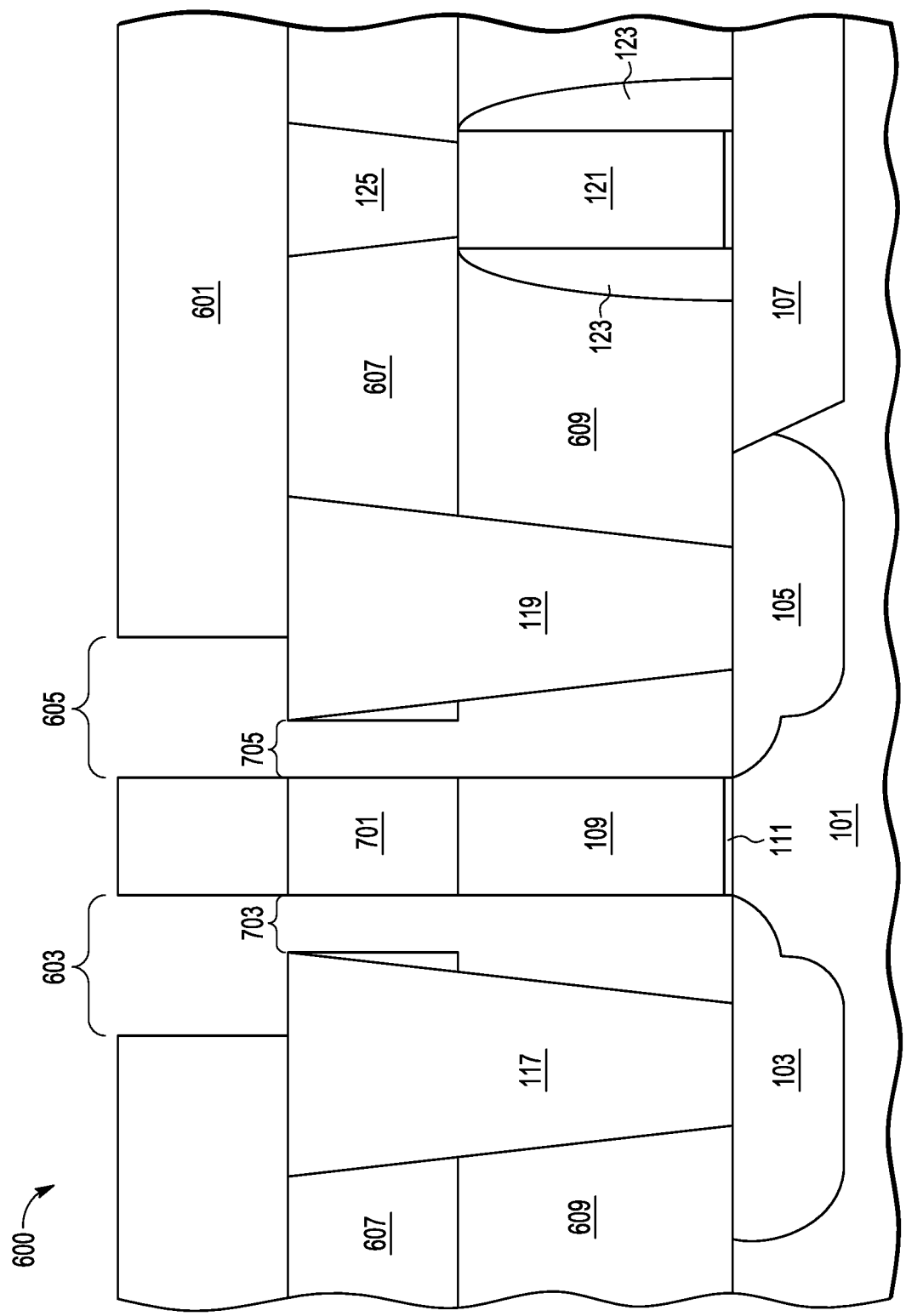

FIG. 8 shows a partial cutaway side view of wafer 600 after portions of layer 609 and portions of spacer 113 are isotopically etched through openings 703 and 705 in layer 607. In one embodiment, where both layer 609 and spacer 113 are made of an oxide, these structures can be etched with the same etch chemistry. However, they may be etched with different etch chemistries when made of different materials. In some embodiments, layer 609 may be etched by an anisotropic process.

In some embodiments, a second sidewall spacer (not shown) is formed on the sacrificial gate structure (not shown) prior to the formation of spacer 113. This second sidewall spacer is made out of a different dielectric material (e.g. nitride) than spacer 113 and may or may not be removed in forming an air gap. The second sidewall spacer protects gate dielectric 111 during the removal of spacer 113.

Figure 9:
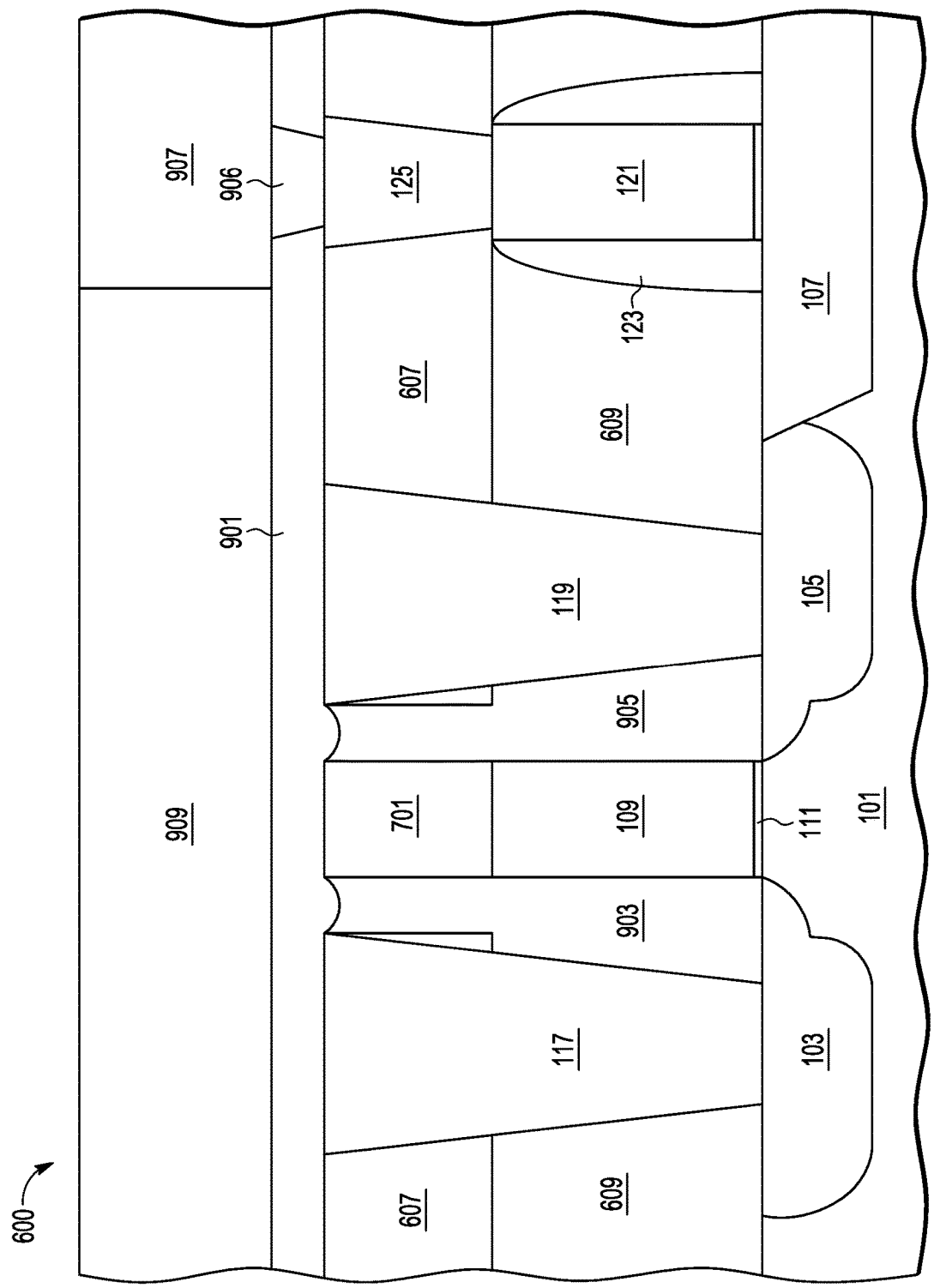

FIG. 9 shows a partial cutaway side view of wafer 600 after mask 601 has been removed and a layer 901 of dielectric material is formed over wafer 600 to seal openings 703 and 705 to form air gaps 903 and 905, respectively. In one embodiment, layer 901 is formed over wafer 600 to form spacer air gaps 903 and 905. In one embodiment, layer 901 is formed by CVD, PVD, or spin-on processes with poor step coverage.

After the formation of layer 901, vias (906) are formed in layer 901 to electrically contact the contacts (with via 906 shown in FIG. 9). Afterwards, interconnects (907) are formed in a dielectric layer 909 that are electrically coupled to the vias located in layer 901. In some embodiments, subsequent layers of interconnects (not shown) are form over wafer 600 prior to wafer singulation.

Figure 10:
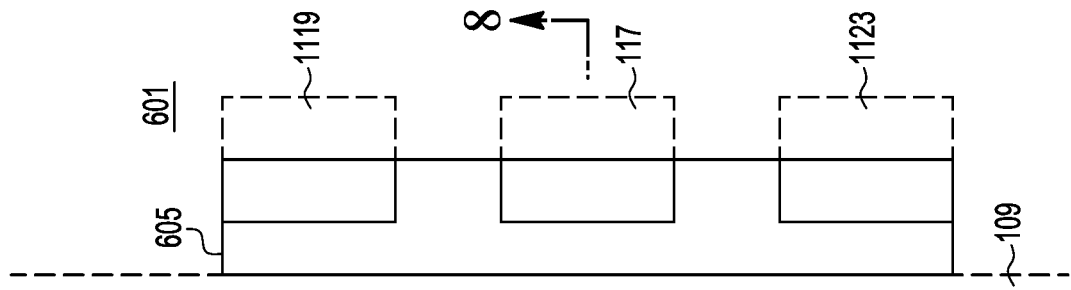
FIGS. 10 and 11 are partial top views of a wafer according to different embodiments of the present invention.
Figure 10:
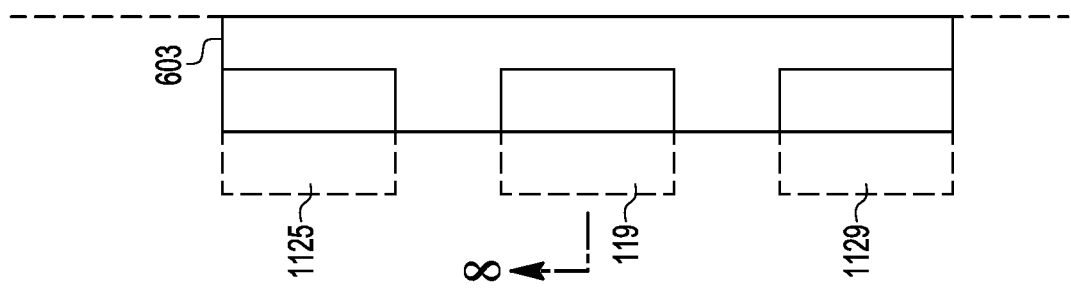

FIG. 10 is a partial top view of one embodiment of wafer 600 at the stage of FIG. 8 showing openings 603 and 605 in mask 601. In the embodiment of FIG. 10, contacts 117 and 119 run the length of the transistor.

Figure 11:
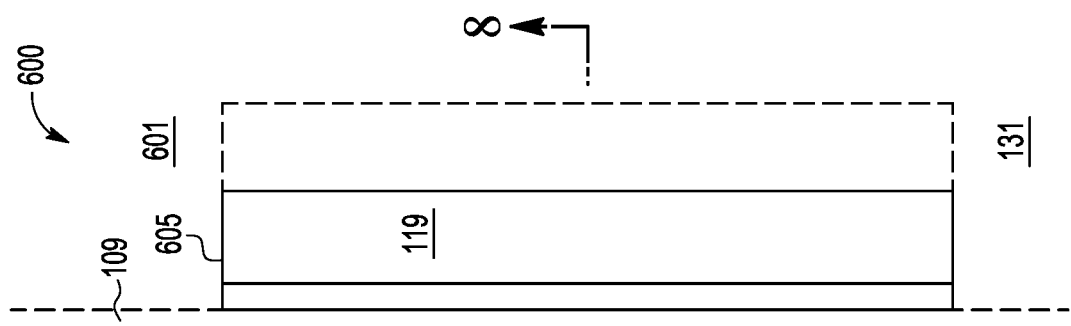
Figure 11:
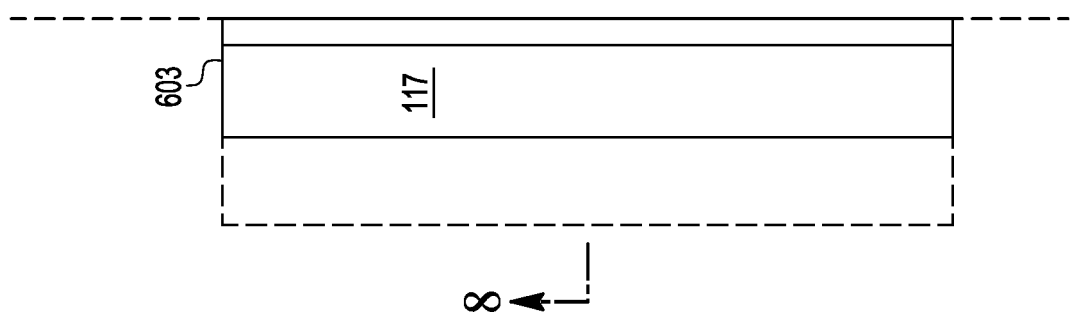

FIG. 11 is a partial top view wafer 600 in an alternative embodiment where each current terminal region 103 and 105 includes multiple contacts (contacts 1125, 117, and 1129 are electrically connected to region 103 and contacts 1119, 119, and 1123 are electrically connected to region 105).

Referring back to FIG. 9, leaving a portion 701 of layer 607 over structure 109 reduces the opening in layer 607 that has to be covered by layer 901 in order to form air gaps 903 and 905. Also, anisotropically etching layer 607 narrows the openings 703 and 705 which makes closing those openings with layer 901 easier than if those openings were wider.

FIGS. 12, 14, 16, and 18 show one partial side cutaway view of wafer 1200 during various stages during the manufacture of a semiconductor device according to another embodiment of the present invention. FIGS. 13, 15, 17, and 19, show a different partial cutaway side view of wafer 1200 during the same stages of manufacture of the semiconductor device as shown in FIGS. 12, 14, 16, and 18, respectively.

Figure 13:
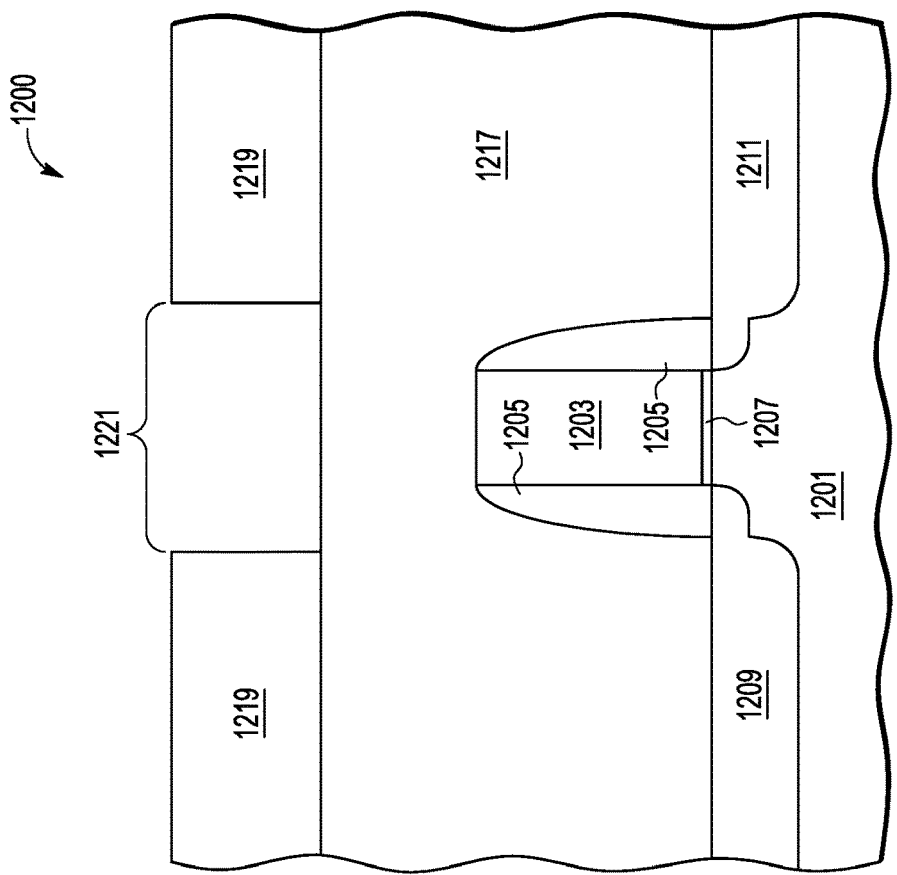
FIGS. 12-19 are partial cross-sectional side views of a wafer at various stages and at two different locations during the manufacture of a semiconductor device according to one embodiment of the present invention.
Figure 12:
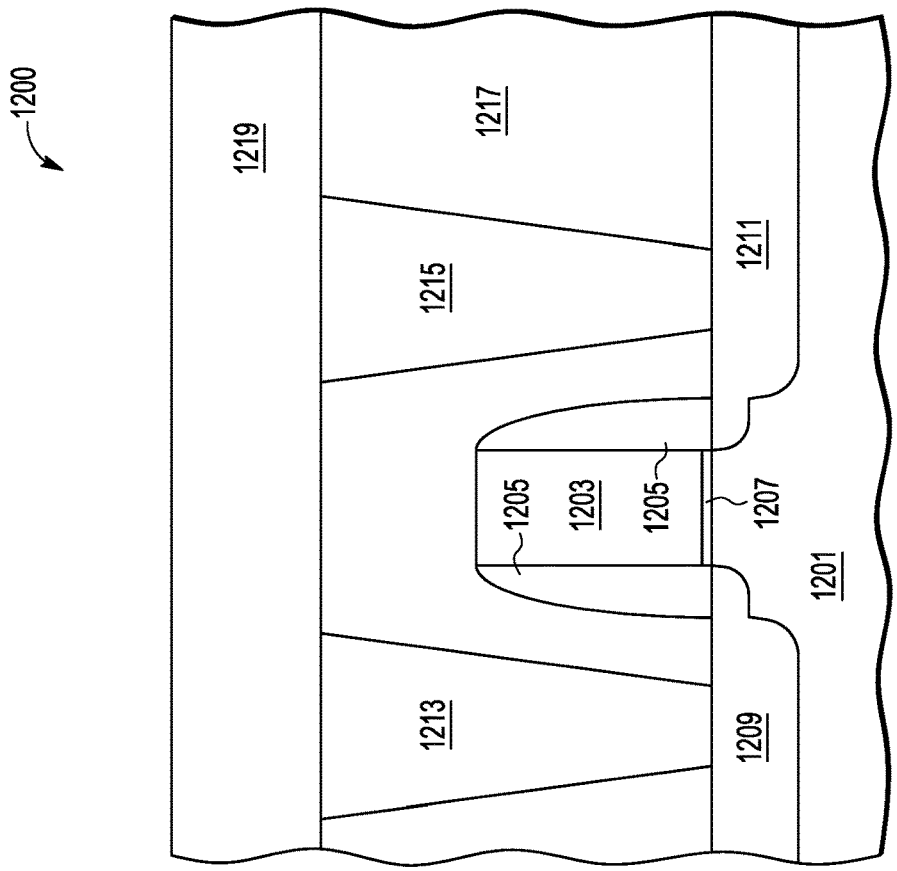
Figure 15:
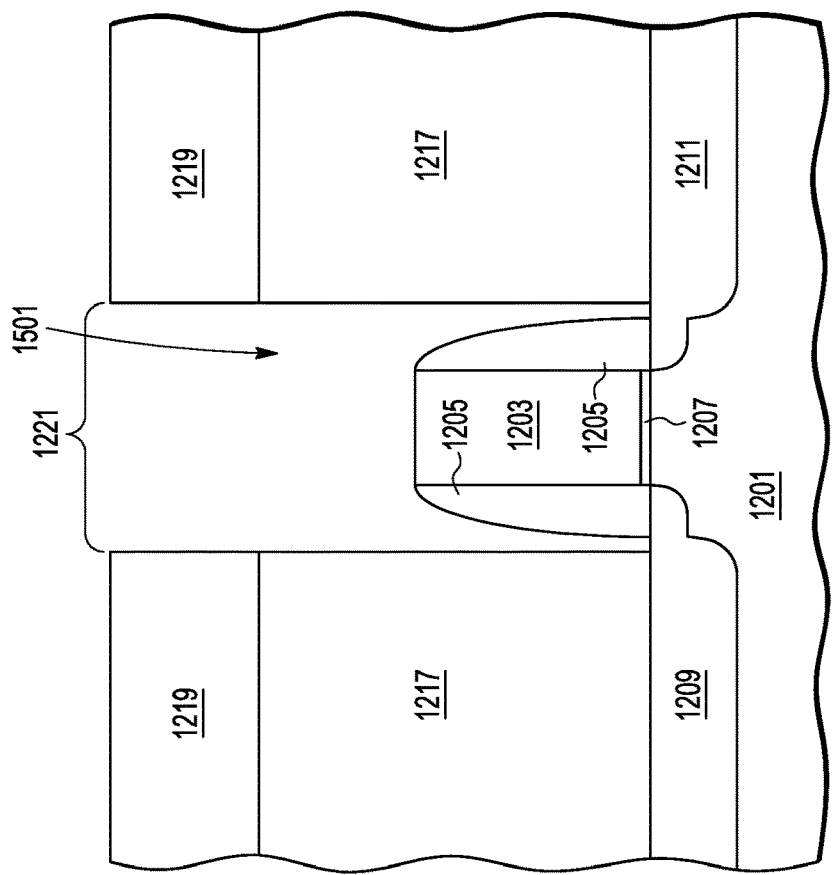
Figure 17:
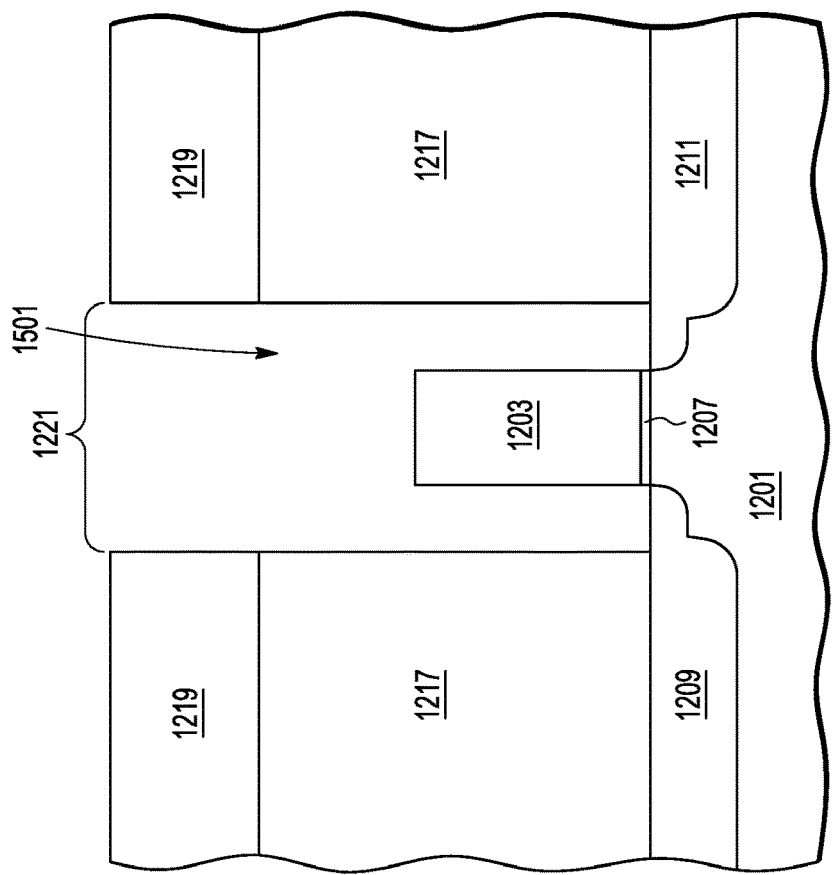
Figure 16:
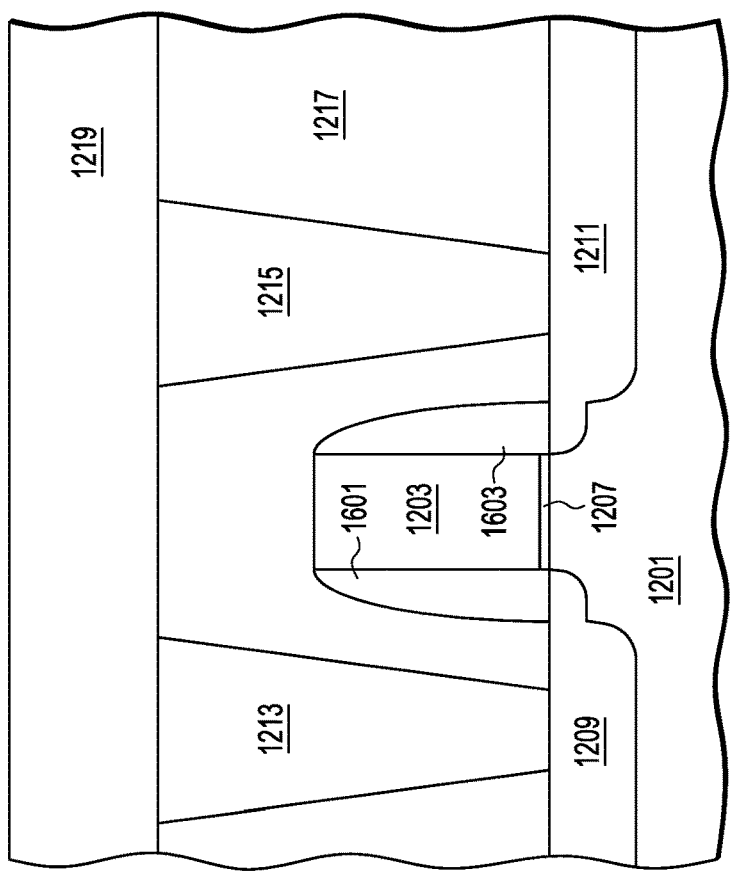
Figure 19:
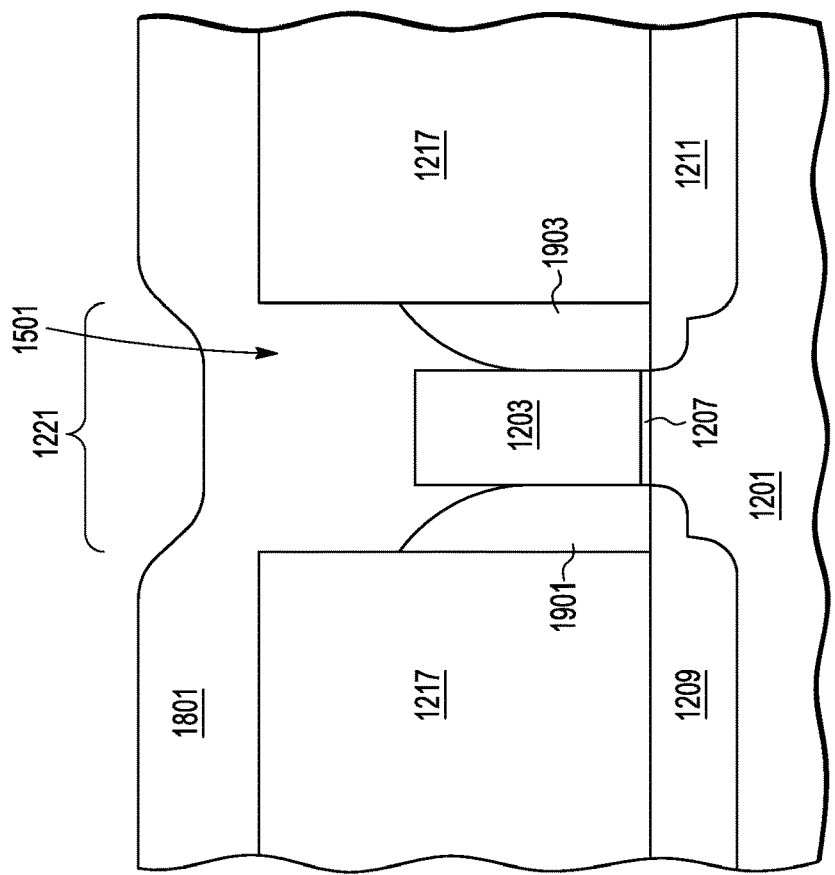
Figure 20:
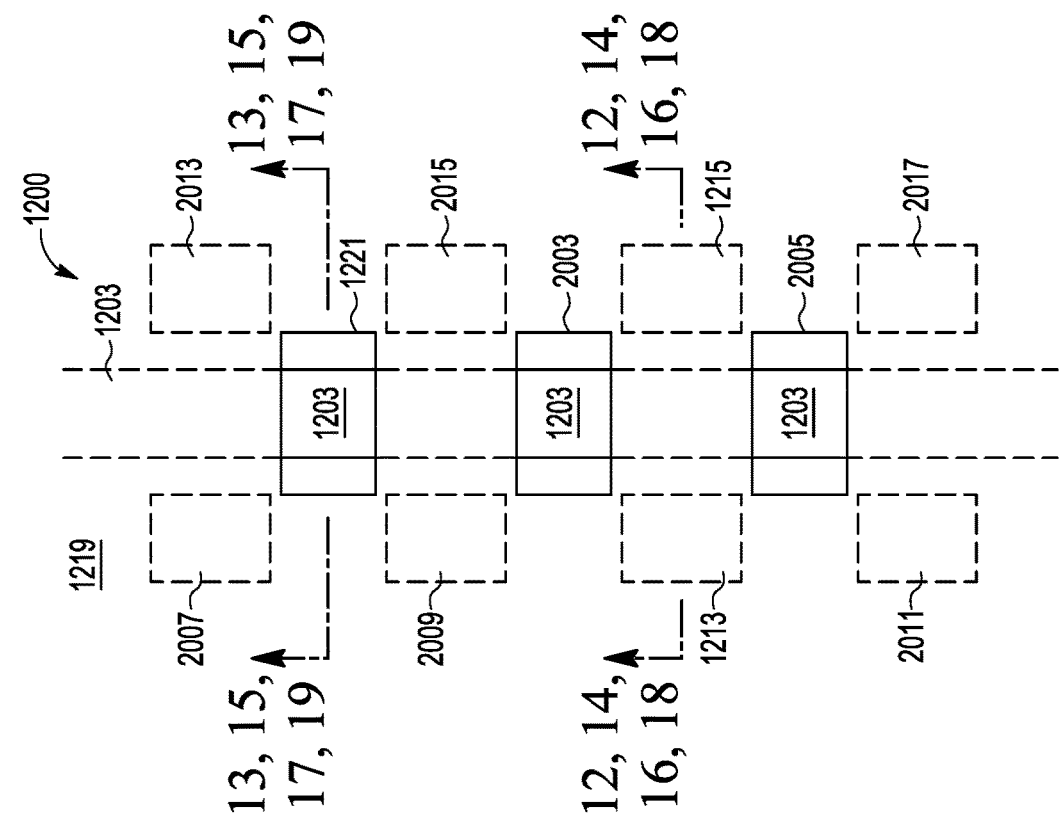
FIG. 20 is a partial top view of a wafer according to one embodiment of the present invention.
Figure 22:
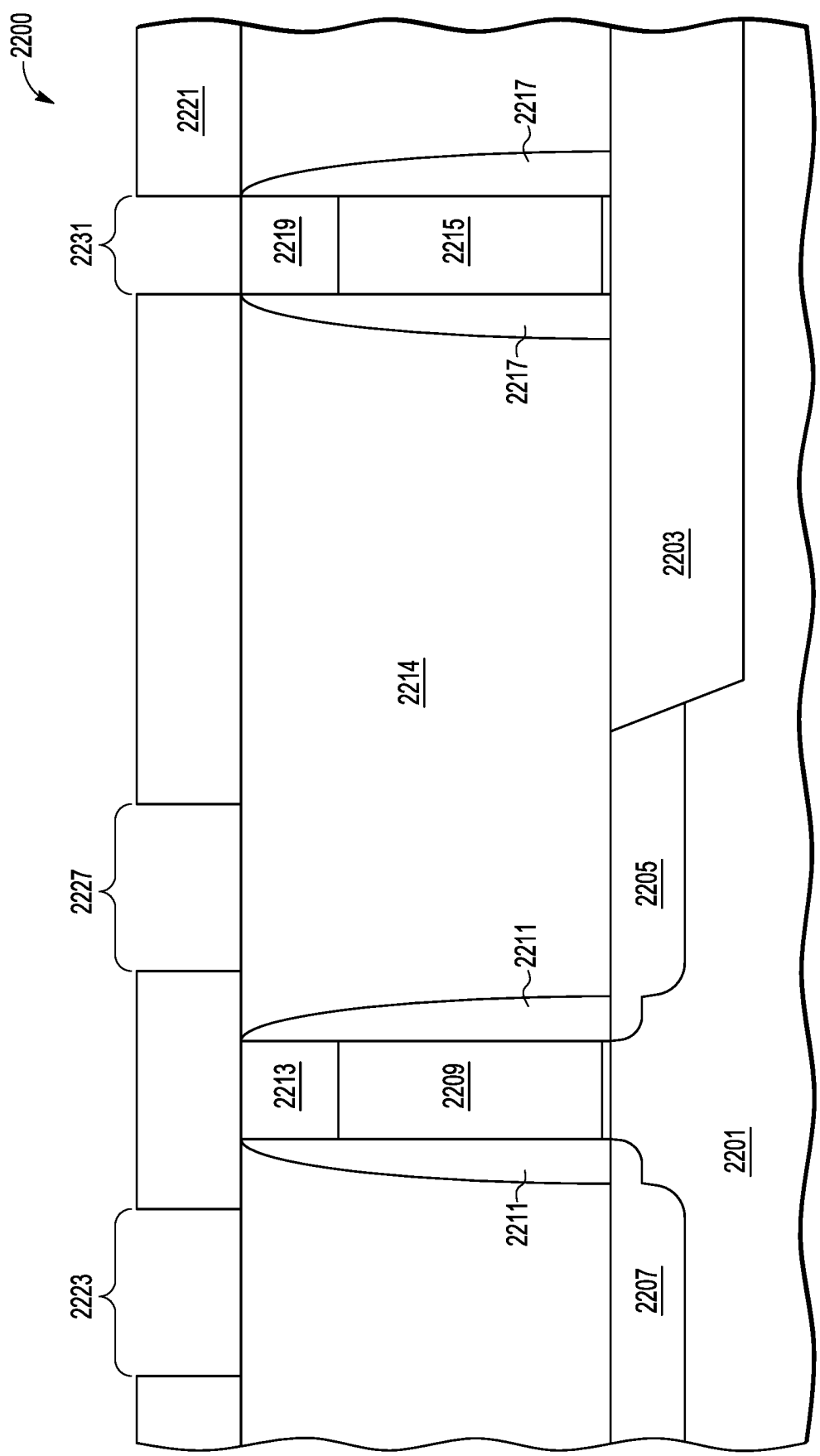

FIG. 20 is a partial top view of wafer 1200 during the stage of FIGS. 16 and 17. FIG. 20 shows the location of the partial cutaway side view of FIGS. 12, 14, 16, 18, and the location of the partial cutaway side view of FIGS. 13, 15, 17, and 19. As shown in FIGS. 20, 12, and 13, the view of FIGS. 12, 14, 16, and 18 is located at a cross-section that cuts through two contacts 1213 and 1215 and a gate structure 1203. The view of FIGS. 13, 15, 17, and 19 is parallel with the view of FIGS. 12, 14, 16, 18 and occurs at a location where there are no contacts.

Referring to FIGS. 12 and 13, wafer 1200 includes a substrate 1201 with implanted current terminal regions 1209 and 1211. Gate structure 1203 is located over a gate dielectric 1207. A sidewall spacer 1205 is located adjacent to gate structure 1203. A dielectric layer 1217 is formed over substrate 1201. In the view of FIG. 12, contacts 1213 and 1215 contact regions 1209 and 1211, respectively. No contacts are located in the view of FIG. 13. A patterned mask 1219 (e.g. photoresist) is formed over wafer 1200. As shown in the views of FIGS. 12, 13, and 20, an opening 1221 in formed over wafer 1200 in the view of FIG. 13 whereas no opening in mask 1219 is located in the view of FIG. 12.

Figure 14:
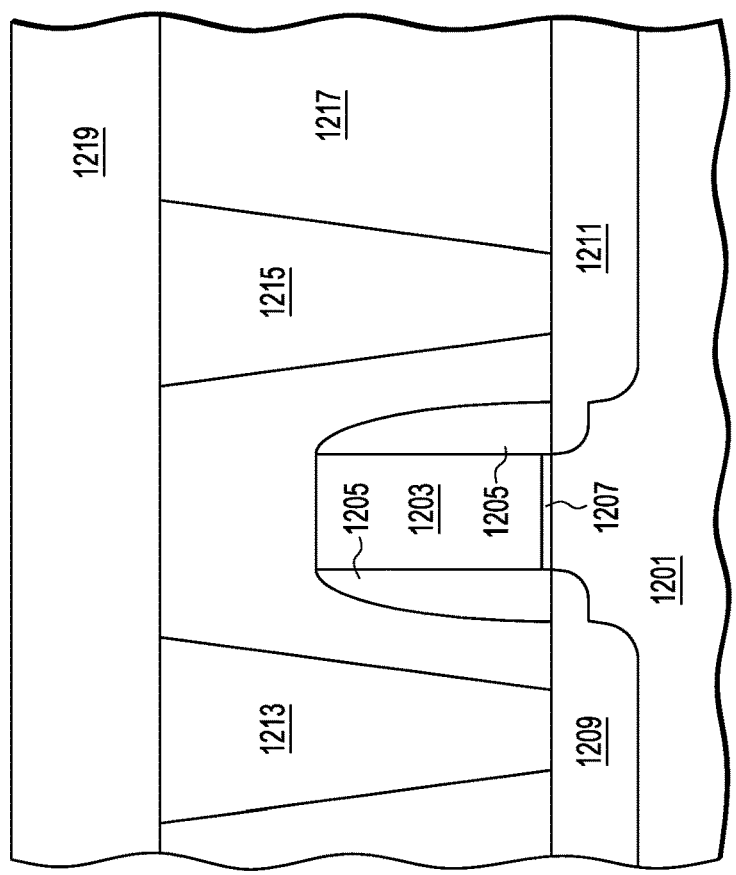

FIGS. 14 and 15 show partial cross-sectional side views after layer 1217 is etched through opening 1221 to expose sidewall spacer 1205. In one embodiment, this etch is performed with an anisotropic etch so that the sidewalls of opening 1501 are relatively vertical. As shown in FIG. 14, the portion of layer 1217 directly over gate structure 1203 and spacer 1205 at the cross-sectional view of FIG. 15 remains after the etching of layer 1217. In some embodiments where spacer and layer 1217 are made of the same material, the anisotropic etching of layer 1217 would also remove spacer 1205 in the cross-section of FIG. 15 but not in the cross-section of FIG. 14.

FIGS. 16 and 17 show partial cross-sectional side views after spacer 1205 is isotropically etched for removal. In one embodiment, spacer 1205 is removed with an etch chemistry of CHF3 and SF6. The isotropic etching of spacer 1205 forms openings 1601 and 1603 in layer 1217. The portions of layer 1217 located directly over gate structure 1203 and directly laterally between gate structure 1203 and contact 1213 and between gate structure 1203 and contact 1215 in the partial cross-sectional view of FIG. 16 remain after the spacer etching. FIG. 20 is a partial top view of wafer 1200 at this stage.

Figure 18:
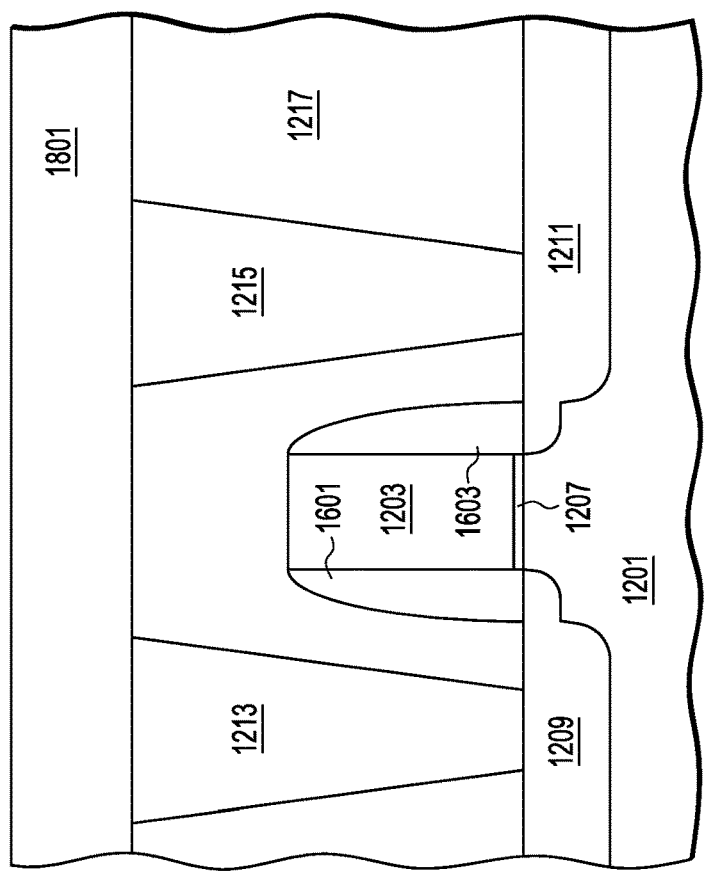

FIGS. 18 and 19 show partial cross-sectional side views after dielectric layer 1801 is formed over wafer 1200 to form air gaps 1901 and 1903. Air gap 1901 includes opening 1601 and air gap 1903 includes opening 1603. In one embodiment, layer 1801 is made of silicon nitride and is formed by a CVD, PVD, or spin-on process, but may be made by other processes and formed by other materials in other embodiments.

As shown in the embodiment of FIGS. 18 and 19, a portion of the sealing layer 1801 is deposited laterally between the portion of gate structure 1203 and the side wall of layer 1217 in opening 1501. However, because opening 1221 is formed at a cross-section where there are no contacts (e.g. 1213, 1215), the dielectric of layer 1801 located in the opening does not significantly increase the gate-to-contact capacitance. In the cross-section of FIG. 18, because layer 1217 remains directly over gate structure 1203 and openings 1601 and 1603, no material of layer 1801 is deposited in openings 1601 and 1603. Accordingly, the shape of the airgaps 1901 and 1903 in the areas wherein layer 1217 does not have top openings is essentially that of removed spacer 1205. Such a consistent shape provides for a consistent amount of gate to contact capacitance in those areas for the transistor of FIGS. 12-20 regardless of the process conditions for forming layer 1801.

FIG. 20 shows a partial top view of wafer 1200. As shown in FIG. 20, the openings 1221, 2003, and 2005 in mask 1219 can be located in places that are not laterally directly between gate structure 1203 and a contact structure (e.g. 1213, 1215) in a direction (to the left and right of the view of FIG. 20) that is transverse to the direction (up and down in the view of FIG. 20) that gate structure runs on wafer

1200. Thus, those portions of gate structure 1203 that are closest to a contact (1213, 1215) have an air gap that is defined by the shape of the sacrificial spacer (1215) without material of sealing layer 1801 being located therein. In the embodiment of FIG. 20, contacts 2007, 2009, 1213, and 2011 are in contact with current terminal region 1209 and contacts 2013, 2015, 1215, and 2017 are in contact with current terminal region 1211.

In some embodiments, layer 1217 is made of a different material than spacer 1205 which allows layer 1217 to be anisotropically etched and spacer 1205 to be isotopically etched. In other embodiments, a relatively thin layer of a second dielectric may be located over control gate structure 1203 and spacer 1205 and underneath layer 1217.

In other embodiments, the openings (e.g. 1221, 2003, and 2005) in mask 1219 may have different shapes and/or may be located in different places on the wafer with respect to the transistor. For example, referring to FIG. 20, the openings in mask 1219 may be located such that they not directly over gate structure 1203, but instead are located on either side of gate structure 1203 (similar to the openings in FIGS. 10 and 11). In some embodiments, the number, size, shape, and/or locations of the openings in the mask 1219 are dependent upon the desired location of the air gaps, the effectiveness in sealing the openings with a dielectric layer 1801, the smallest critical dimension of the photolithographic processes in patterning a mask, the total area of contacts needed per region, and the effectiveness of the isotropic etch process in removing portions of spacer 1205 that are not directly exposed from the top through an opening in layer 1217. In other embodiments, layer 1217 may be two layers of different dielectric materials. See the embodiment of FIGS. 6-9.

In other embodiments, the opening(s) in the mask (1219) that allow for the accessibility of etchant for the removal of the material of a sidewall spacer (1603) may be located in other areas of a wafer outside of the transistor area.

Figure 21:
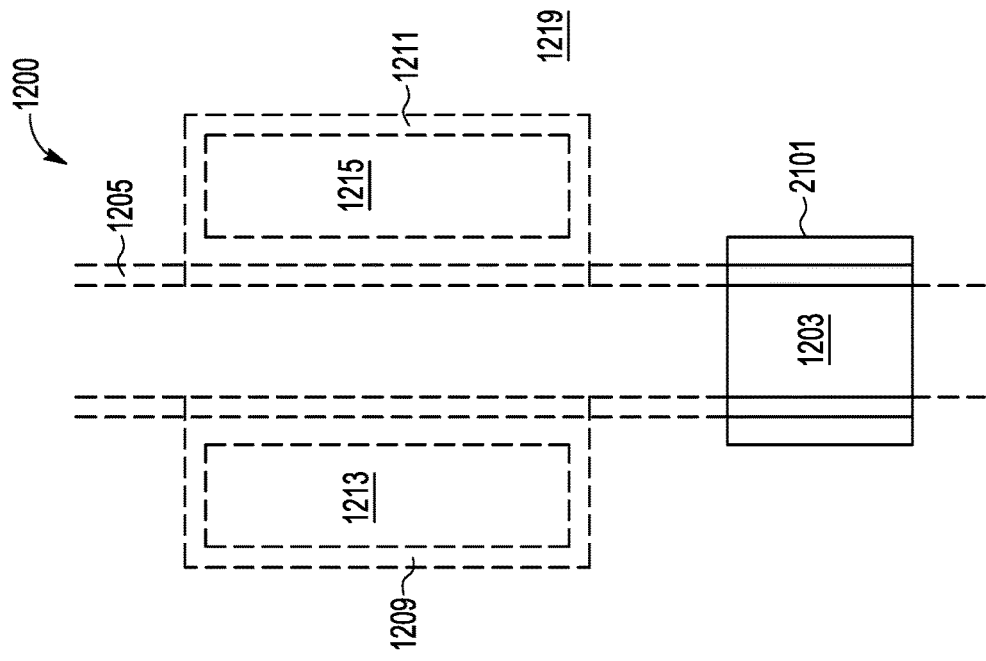
FIGS. 21-27 are partial cross-sectional side views of a wafer at various stages during the manufacture of a semiconductor device according to one embodiment of the present invention.

FIG. 21 is a partial top view of another embodiment of wafer 1200. In the embodiment of FIG. 21, opening 2101 in mask 1219 is located outside of the transistor area of current terminals 1209 and 1211 (which are shown in dashed lines). From opening 2101, the material of spacer 1205 can be removed under mask 1219 laterally between contact 1213 and gate structure 1203 and laterally between contact 1215 and gate structure 1203 in a direction that is transverse (to the left and right of the view in FIG. 21) relative to the direction (up and down in the view of FIG. 21) that gate structure 1203 runs. Accordingly, the air gaps in these areas will have a well-defined shape in that the material of a sealing layer (1801) will not be deposited in those locations.

FIGS. 22-27 set forth partial side cross-sectional views of a wafer 2200 according to another embodiment of the present invention. Wafer 2200 includes a substrate 2201 with current terminal regions 2207 and 2205 and isolation region 2203. Gate structures 2209 and 2215 are located over substrate 2201. Dielectric structures 2213 and 2219 are located over gate structures 2209 and 2215, respectively. Structure 2209 includes a sidewall spacer 2211 and structure 2215 includes a sidewall spacer 2217. After the formation of spacers 2211 and 2217, a layer 2144 of interlayer dielectric material is formed over wafer 2200 and planarized. Afterwards, a patterned mask 2221 is formed over wafer 2200 with openings 2223, 2227, and 2231. In one embodiment, structures 2213 and 2219 are made of a dielectric material (e.g. nitride) that is etch-selectable from the dielectric material (e.g. oxide) of spacer 2211 and the material of layer 2214. In one embodiment, structures 2213 and 2219 are formed from a layer of dielectric material that is formed over the layer of gate structure material (e.g. polysilicon) of gate structures 2209 and 2215 prior to patterning. The layer of dielectric material and the layer of gate material are then patterned with a patterned mask (not shown). Afterwards, sidewall spacers 2211 and 2217 are formed.

Figure 23:
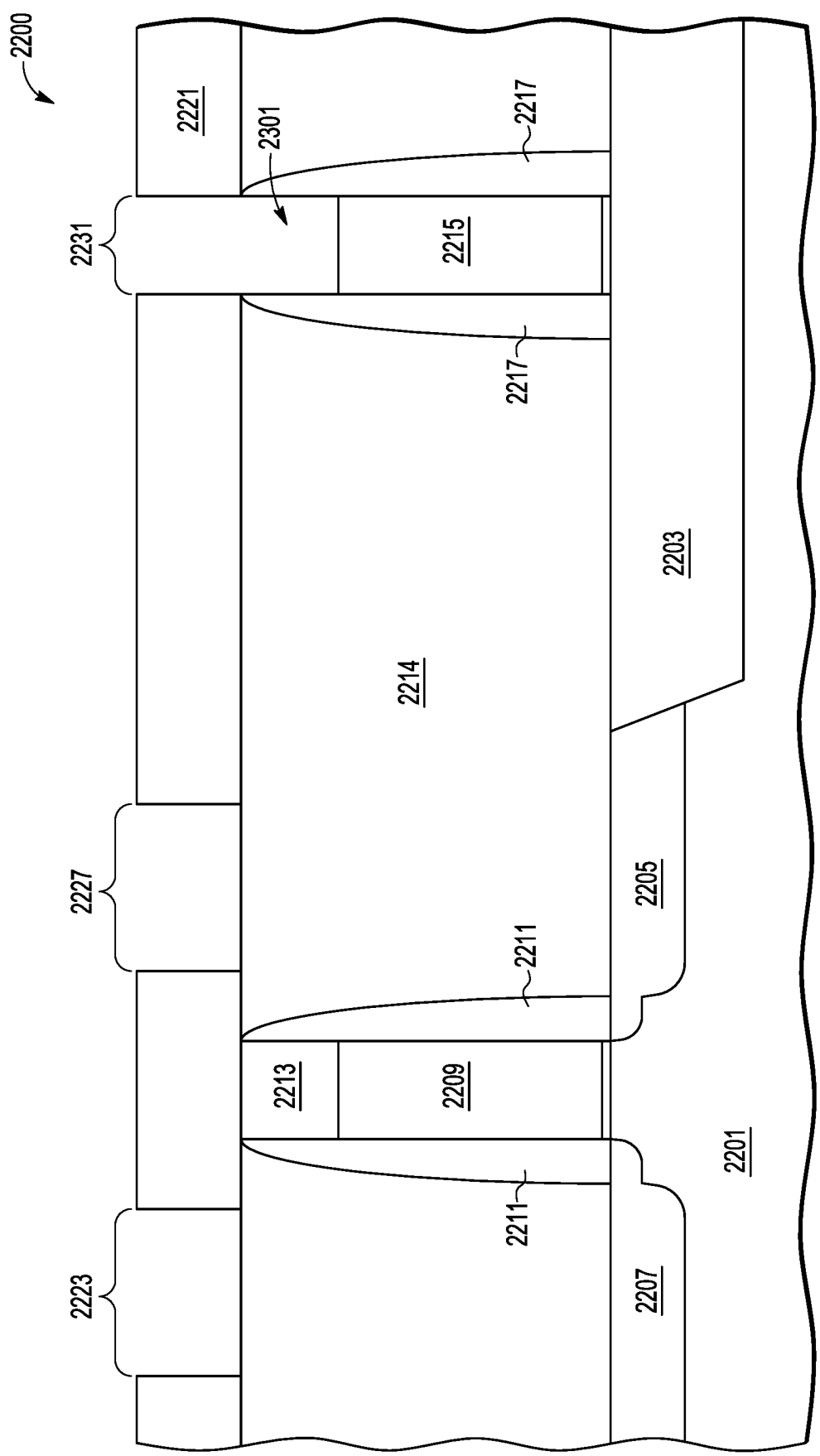
Figure 24:
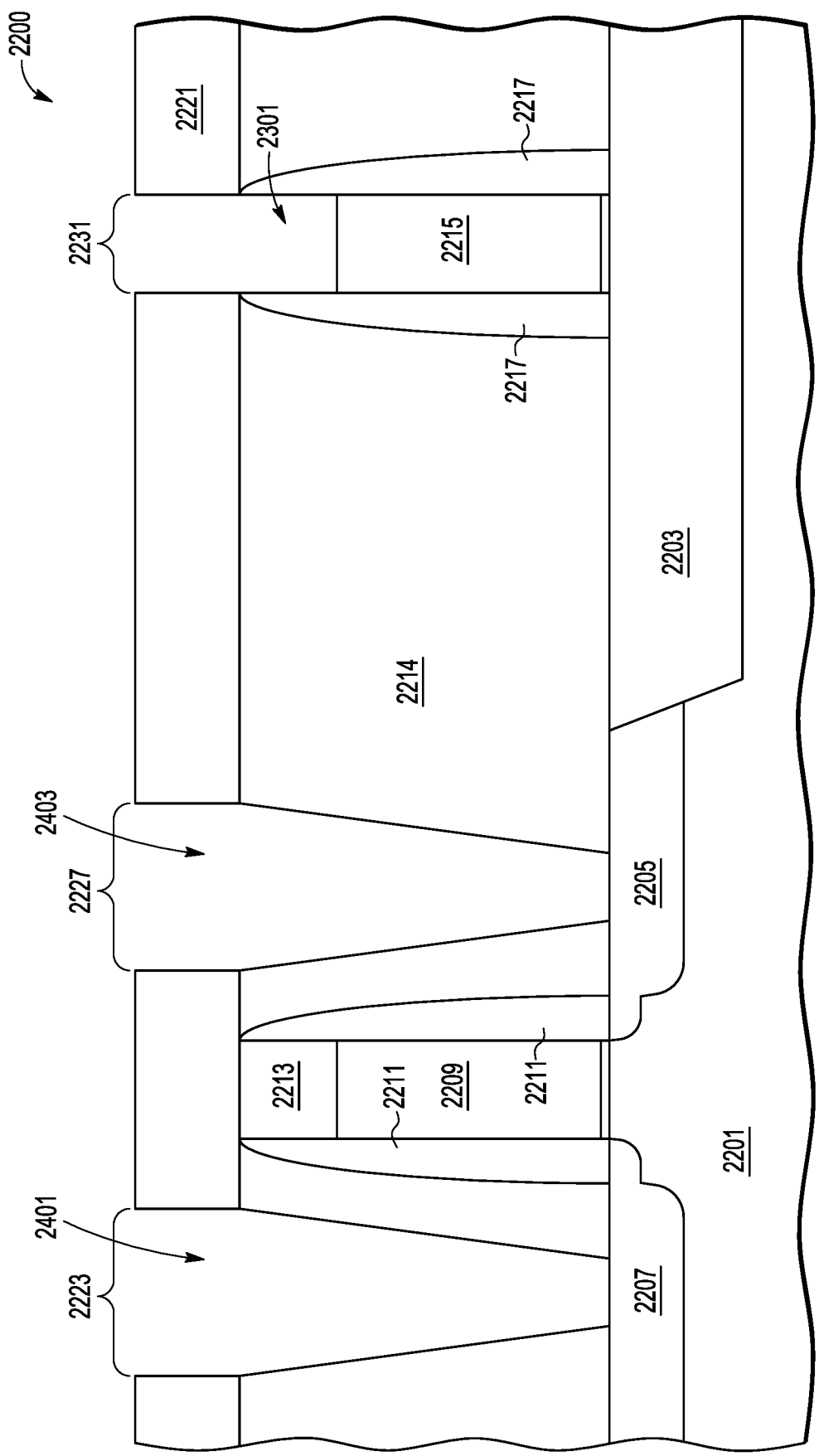
Figure 25:
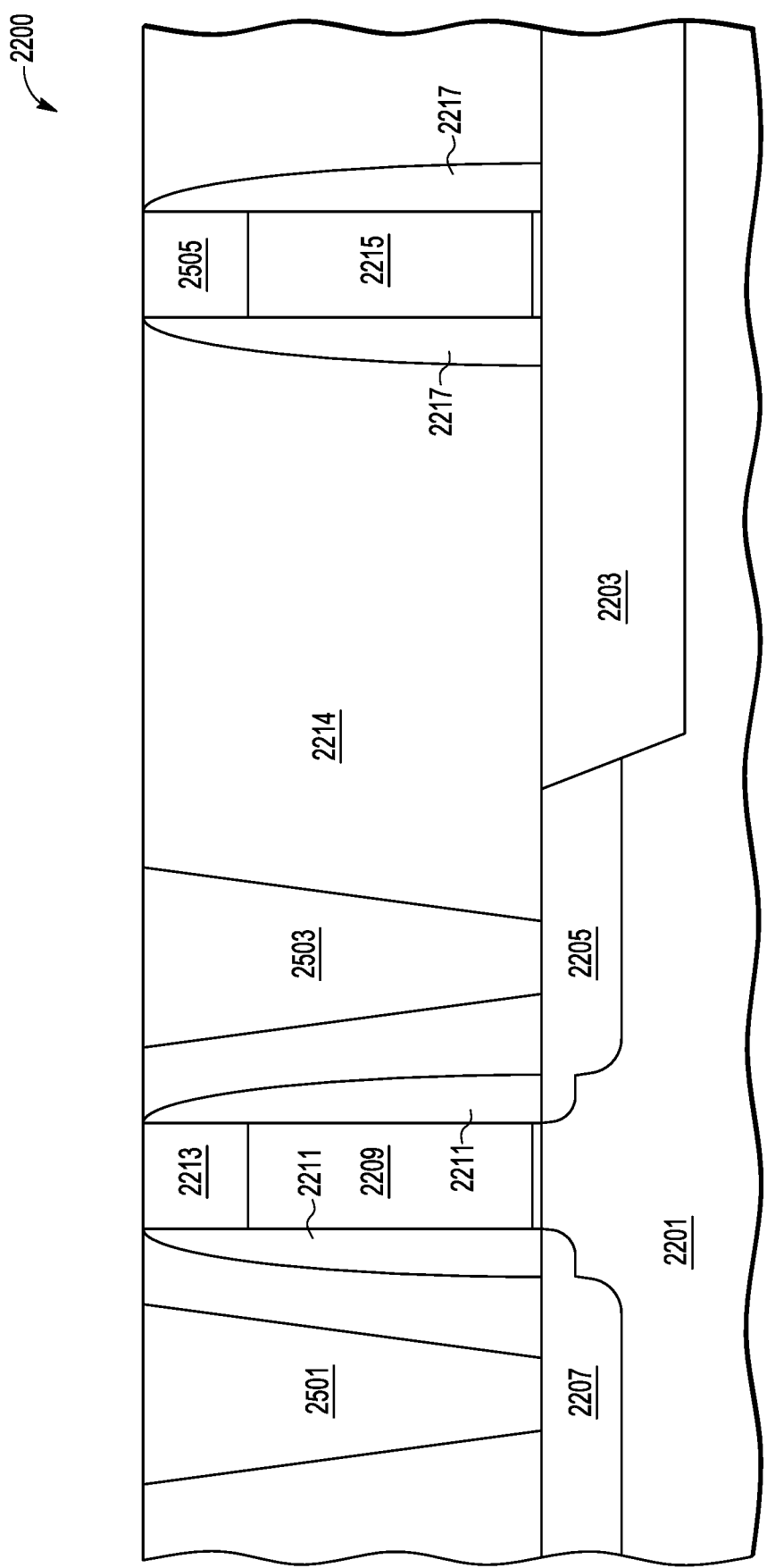

FIG. 23 shows a partial cutaway side view of wafer 2200 after structure 2219 is removed by etching though opening 2231 to form opening 2301. FIG. 24 shows a partial cutaway sideview after openings 2401 and 2403 are formed in layer 2214 by etching through openings 2223 and 2227. In some embodiments, openings 2401, 2403, and 2301 are formed with the same etch chemistry during the same etch process. FIG. 25 shows the same partial side view after contact material is formed in openings 2401, 2403, and 2301 and wafer 2200 is planarized to form contacts 2501, 2503, and 2505 respectfully.

Figure 26:
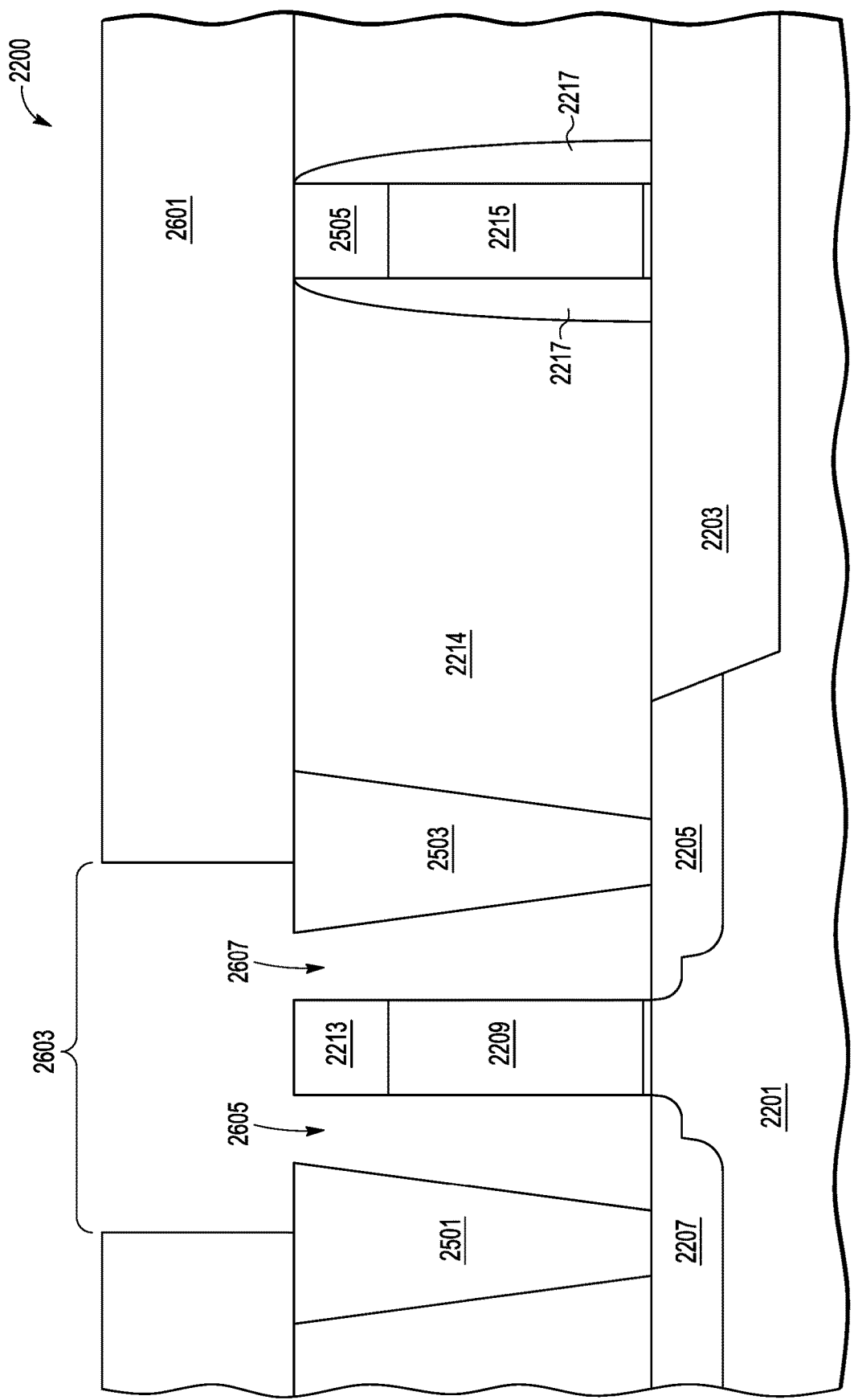

FIG. 26 shows a partial cross-sectional side view of wafer 2200 after a patterned mask 2601 is formed on wafer 2200 and openings 2605 and 2607 are formed by isotopically etching layer 2214 and spacer 2211 through the openings. During the removal of portions of layer 2214 and spacer 2211, dielectric structure 2213 remains on gate structure 2209.

Figure 27:
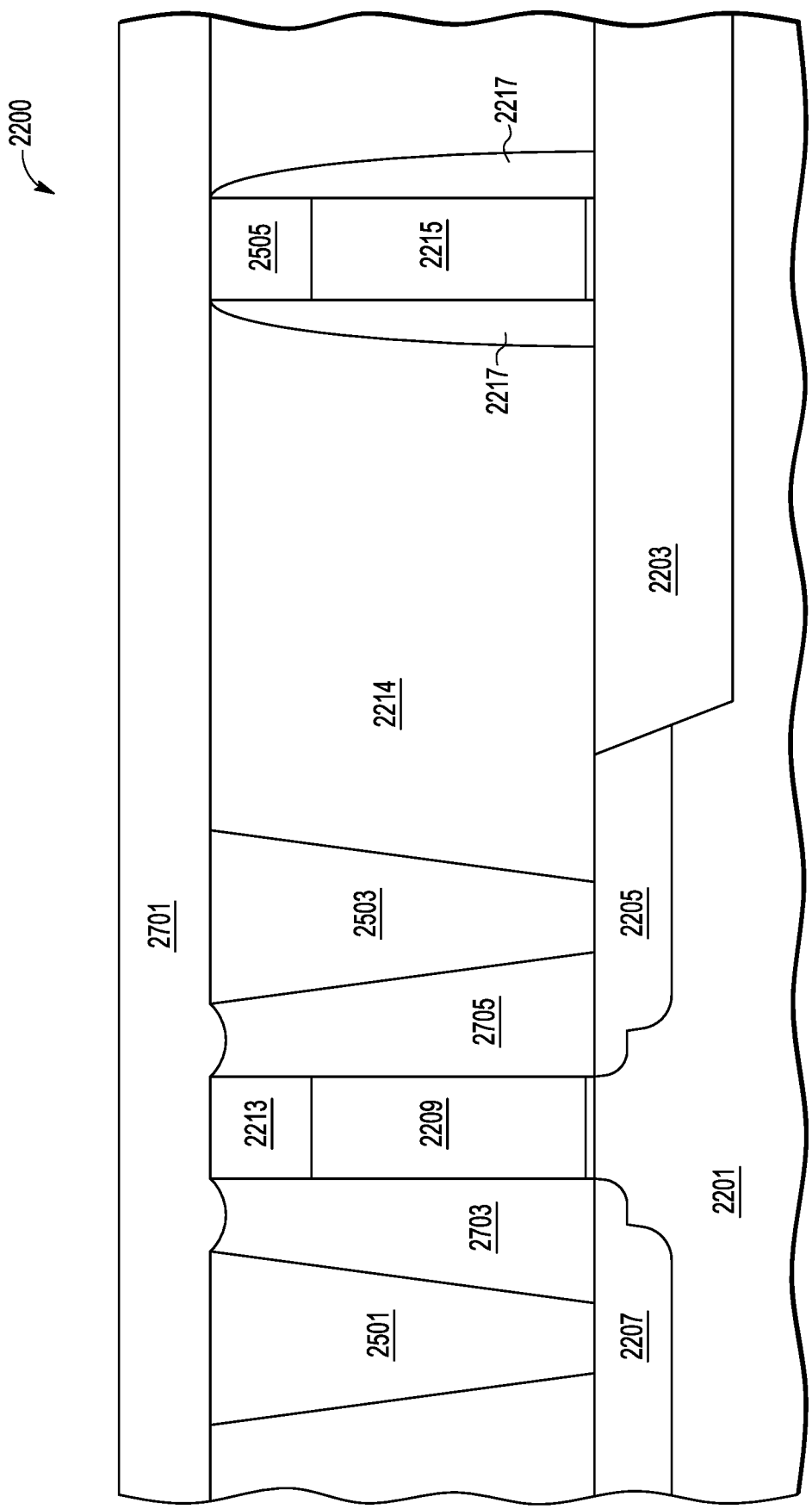

FIG. 27 shows a partial cross-sectional side view of wafer 2200 after layer 2701 is formed on wafer 2200 so as to seal off openings 2605 and 2607 to form air gaps 2703 and 2705, respectively.

Figure 28:
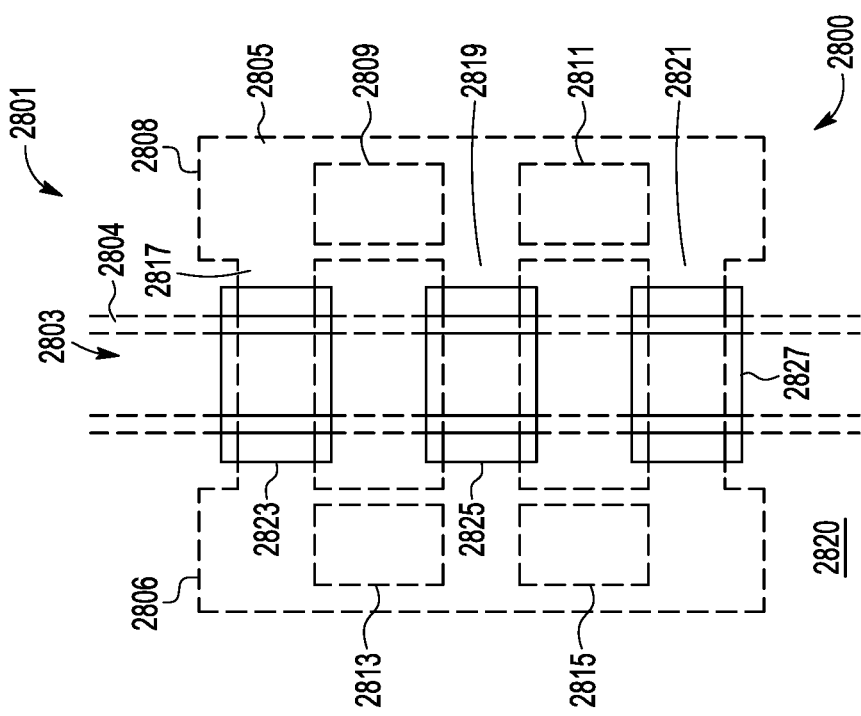
FIG. 28 is a partial top view of a wafer according to one embodiment of the present invention.

FIG. 28 shows a partial top view of a wafer 2800 having a finFET 2801. In the manufacture of finFET 2801, openings 2823, 2825, and 2827 in a patterned mask 2820 for removing spacer material are formed directly over the semiconductor fins 2817, 2819, and 2821 of finFET 2801. The fins 2817, 2819, and 2821 contain the channel regions for finFET 2801 between source structure 2806 located at one end of the fins, which includes a doped source region, and a drain structure 2808 located at the other end of the fins, which includes a doped drain region. In one embodiment, source structure 2806, drain structure 2808, and fins 2817, 2819, and 2821 are made of a semiconductor material whose top surface is located further from the backside of wafer 2800 (not shown) than the semiconductor material surrounding it. In another embodiment, source structure 2806, drain structure 2808, and fins 2817, 2819, and 2821 are located on an insulating layer (not shown).

Gate structure 2803 is formed over fins 2817, 2819, and 2821. Spacer 2804 is formed for gate structure 2803. Both gate structure 2803 and spacer 2804 traverse the fins by going over the fins and in between the fins. Contacts 2813 and 2815 contact the source region of source structure 2806 and contacts 2809 and 2811 contact the drain region of drain structure 2808. In the embodiment shown, the contacts are located in areas lateral to locations of gate structure 2803 between the fins in lines that traverse the direction that the gate structure runs in FIG. 28.

In the embodiment shown, the locations of openings 2823, 2825, and 2827 are selected to minimize the effect on capacitance due to an undesirable deposition of sealing layer material in a location of a removed spacer. With the openings 2823, 2825, and 2827 in mask 2820 over the fins 2817, 2819, and 2821, the portions of spacer 2804 located between the fins can be removed by an isotropic etching of the material without removing the material of mask 2820 and the material of a dielectric layer (e.g. 1217) located directly over those portions. Consequently, when a sealing dielectric layer (e.g. 301) is formed over wafer 2800 to form the airgaps in the locations of the removed spacer 2804, material of the sealing layer will not likely fill the space of the removed spacer at those locations. Accordingly, the space laterally between the gate structure 2803 and the source structure 2806 and between the gate structure 2803 and the drain structure 2808 in a transverse direction from the direction that gate structure 2803 runs (up and down in the view of FIG. 28) will have well-defined airgaps to reduce capacitance between the gate structure 2803 and source structure 2806 and between the gate structure and drain structure 2808. In addition, contacts 2813, 2815, 2809, and 2811 are located farther away from the portions of gate structure 2803 where the openings (2823, 2825, and 2827) are. Accordingly, contacts 2813, 2815, 2809, and 2811, source structure 2806, and drain structure 2808 are located farther from areas where the sealing layer material may undesirably be deposited in the locations of the removed spacer 2804 (the locations of openings 2823, 2825, and 2827) than from the locations (between the fins) of the removed spacer 2804 where the air gap will be well-defined. In other embodiments, the openings can be located in other locations of a finFET depending on where a desired location of well-defined air gaps for maximum capacitance reduction are located.

In some embodiments, providing a method for forming air gaps after the formation of contacts may provide for a process that forms air gaps without contact material undesirably being deposited in a location of a removed spacer. Accordingly, such a process can be utilized to improve the quality of a manufactured integrated circuit by reducing the probability of semiconductor device structures being undesirably shorted together.

As disclosed herein, a first structure is "directly over" a second structure if the first structure is located over the second structure in a line having a direction that is perpendicular with the generally planar major side of the wafer. For example, in FIG. 22, structure 2213 is directly over structure 2209. Structure 2213 is not directly over structure 2215. As disclosed herein, a first structure is "directly beneath" a second structure if the first structure is located beneath the second structure in a line having a direction that is perpendicular with the generally planar major side of the wafer. For example, in FIG. 1, region 107 is directly beneath structure 121. Region 107 is not directly beneath contact 119. One structure is "directly between" two other structures in a line if the two structures are located on opposite sides of the one structure in the line. For example, in FIG. 1, spacer 123 is located directly between structure 109 and 121 in a line in the cut away side view of FIG. 1. Mask 131 is not located directly between structures 109 and 121.

Features specifically shown or described with respect to one embodiment set forth herein may be implemented in other embodiments set forth herein.

In one embodiment, a method for making a semiconductor device includes forming a terminal structure for a semiconductor device over a wafer, forming a sidewall spacer for the terminal structure, and after forming the sidewall spacer, forming at least one contact for the semiconductor device. The at least one contact is electrically conductive. The method includes after forming the at least one contact, removing at least a portion of the sidewall spacer in a first area of the wafer. The method includes after the removing, forming a layer over the wafer to form an air gap. The air gap including a portion in the first area where the sidewall spacer was removed.

In another embodiment, a method of forming a semiconductor device includes forming a control terminal structure for a semiconductor device over a wafer, forming a sidewall spacer for the control terminal structure, and after forming the sidewall spacer, forming a layer of dielectric material over the wafer. The method includes after forming the layer of dielectric material, forming at least one contact for the semiconductor device. The at least one contact is electrically conductive. The forming the at least one contact includes forming a first set of at least one opening in the layer of dielectric material. The method includes after forming the at least one contact, removing at least a portion of the sidewall spacer in a first area of the wafer. The removing includes removing the at least a portion of the sidewall spacer in the first area through a second set of at least one opening in the layer of dielectric material. The method includes after the removing, forming a layer over the wafer to form an air gap. The air gap includes a portion in the first area where the sidewall spacer was removed.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making a semiconductor device, the method comprising:
    forming a terminal structure for a semiconductor device over a wafer;
    forming a sidewall spacer for the terminal structure;
    after forming the sidewall spacer, forming at least one contact for the semiconductor device, the at least one contact being electrically conductive;
    after forming the at least one contact, removing at least a portion of the sidewall spacer in a first area of the wafer;
    after the removing, forming a layer over the wafer to form an air gap, the air gap including a portion in the first area where the sidewall spacer was removed;
    after forming the sidewall spacer and before forming the at least one contact, forming a layer of dielectric material over the wafer, wherein the removing includes removing the at least a portion of the sidewall spacer in the first area through at least one opening in the dielectric material;
    wherein forming the at least one contact includes forming a first set of at least one opening in the layer of dielectric material, wherein the removing the at least a portion includes forming a second set of at least one opening in the layer of dielectric material;
    wherein the second set of at least one opening does not include an opening directly over the portion of the first area, wherein the layer of dielectric material directly over the portion of the first area remains during the removing.

2. The method of claim 1 wherein the first area is located laterally between the terminal structure and a second area of the wafer defined by a contact of the at least one contact in a line parallel to a major side of the wafer.

3. The method of claim 2 wherein the semiconductor device is a transistor and the contact is a contact for a current terminal of the transistor and the terminal structure is a control terminal structure for the transistor.

4. A method for making a semiconductor device, the method comprising:
    forming a terminal structure for a semiconductor device over a wafer;

forming a sidewall spacer for the terminal structure;
after forming the sidewall spacer, forming at least one contact for the semiconductor device, the at least one contact being electrically conductive;
after forming the at least one contact, removing at least a portion of the sidewall spacer in a first area of the wafer;
after the removing, forming a layer over the wafer to form an air gap, the air gap including a portion in the first area where the sidewall spacer was removed;
wherein the terminal structure includes a portion laterally adjacent to the first area, wherein a portion of a dielectric structure is located directly over the portion of the terminal structure during the removing, wherein the layer is formed directly over the portion of the dielectric structure.

5. The method of claim 4 wherein a second portion of the dielectric structure is removed to form a contact to the terminal structure.

6. The method of claim 4 further comprising:
after forming the sidewall spacer and before forming the at least one contact, forming a layer of dielectric material over the wafer, wherein the removing includes removing the at least a portion of the sidewall spacer in the first area through at least one opening in the dielectric material, wherein the dielectric structure and the layer of dielectric material are made of different dielectric materials.

7. The method of claim 1 wherein the layer is formed by a process comprising at least one of chemical vapor deposition (CVD) and physical vapor deposition (PVD), wherein the process is performed at a pressure in the range of 1000 Pa to 110,000 Pa.

8. The method of claim 4 further comprising after forming the sidewall spacer and before forming the at least one contact, forming a layer of dielectric material over the wafer, wherein the removing includes removing the at least a portion of the sidewall spacer in the first area through at least one opening in the dielectric material.

9. A method for making a semiconductor device, the method comprising:
forming a terminal structure for a semiconductor device over a wafer;
forming a sidewall spacer for the terminal structure;
after forming the sidewall spacer, forming at least one contact for the semiconductor device, the at least one contact being electrically conductive;
after forming the at least one contact, removing at least a portion of the sidewall spacer in a first area of the wafer;
after the removing, forming a layer over the wafer to form an air gap, the air gap including a portion in the first area where the sidewall spacer was removed;
after forming the sidewall spacer and before forming the at least one contact, forming a layer of dielectric material over the wafer, wherein the removing includes removing the at least a portion of the sidewall spacer in the first area through at least one opening in the dielectric material;
wherein the terminal structure includes a portion running in a first direction, a contact of the at least one contact defines a second area of the wafer, wherein the first area includes a portion located directly between the second area and the terminal structure in a line that is oriented laterally between the terminal structure and the second area and transverse to the first direction, wherein dielectric material of the layer remains directly over the terminal structure along the line during the removing.

10. A method for making a semiconductor device, the method comprising:
forming a terminal structure for a semiconductor device over a wafer;
forming a sidewall spacer for the terminal structure;
after forming the sidewall spacer, forming at least one contact for the semiconductor device, the at least one contact being electrically conductive;
after forming the at least one contact, removing at least a portion of the sidewall spacer in a first area of the wafer;
after the removing, forming a layer over the wafer to form an air gap, the air gap including a portion in the first area where the sidewall spacer was removed;
after forming the sidewall spacer and before forming the at least one contact, forming a layer of dielectric material over the wafer, wherein the removing includes removing the at least a portion of the sidewall spacer in the first area through at least one opening in the dielectric material;
wherein the terminal structure includes a portion running in a first direction, a contact of the at least one contact defines a second area of the wafer, wherein the first area includes a portion located directly between the second area and the terminal structure in a line that is oriented laterally between the terminal structure and the second area and transverse to the first direction, wherein the dielectric material remains directly over the portion of the first area during the removing.

11. The method of claim 10 wherein the portion of the first area is located over a semiconductor fin.

12. The method of claim 10 wherein the portion of the first area is located between two fins each running in a second direction perpendicular to the first direction.

13. The method of claim 8 wherein forming the at least one contact includes forming a first set of at least one opening in the layer of dielectric material, wherein the removing the at least a portion includes forming a second set of at least one opening in the layer of dielectric material.

14. The method of claim 13 wherein the second set of at least one opening includes an opening directly over the portion of the first area.

15. The method of claim 13 wherein the second set of at least one opening does not include an opening directly over the portion of the first area, wherein the layer of dielectric material directly over the portion of the first area remains during the removing.

16. The method of claim 1 wherein the second set of at least one opening includes an opening over a second area, the second area includes a second portion of the sidewall spacer.

17. The method of claim 1 wherein the terminal structure includes a portion running along a first direction, wherein the forming at least one contact includes forming a contact to an area of the terminal structure that is spaced apart from the first area along the first direction.

18. The method of claim 17 wherein the terminal structure is a gate structure for a transistor, wherein the gate structure is formed after the forming the sidewall spacer.

19. The method of claim 4 wherein the terminal structure includes a portion running in a first direction, a contact of the at least one contact defines a second area of the wafer, wherein the first area includes a portion located directly between the second area and the terminal structure in a line that is oriented laterally between the terminal structure and the second area and transverse to the first direction, wherein the dielectric material remains directly over the portion of the first area during the removing.

20. The method of claim 9 wherein the terminal structure includes a portion running in a first direction, a contact of the at least one contact defines a second area of the wafer, wherein the first area includes a portion located directly between the second area and the terminal structure in a line that is oriented laterally between the terminal structure and the second area and transverse to the first direction, wherein the dielectric material remains directly over the portion of the first area during the removing.

* * * * *